(12) United States Patent
Kim et al.

(10) Patent No.: US 10,305,021 B2
(45) Date of Patent: May 28, 2019

(54) PIEZOELECTRIC MATERIAL COMPRISING POLY(D-LACTIC ACID)/POLY(L-LACTIC ACID) STEREOCOMPLEX CRYSTALS

(71) Applicant: University-Industry Cooperation Group of Kyung Hee University, Yongin-si, Gyeonggi-do (KR)

(72) Inventors: Kap Jin Kim, Suwon-si (KR); Eun Hye Song, Seoul (KR)

(73) Assignee: University-Industry Cooperation Group of Kyung Hee University, Yongin-si, Gyeonggi-do (KR)

( * ) Notice: Subject to any disclaimer, the term of this patent is extended or adjusted under 35 U.S.C. 154(b) by 242 days.

(21) Appl. No.: 15/180,089

(22) Filed: Jun. 13, 2016

(65) Prior Publication Data
US 2017/0179370 A1   Jun. 22, 2017

(30) Foreign Application Priority Data
Dec. 22, 2015 (KR) .................. 10-2015-0184053

(51) Int. Cl.
H01L 41/113 (2006.01)
H01L 41/45 (2013.01)
G01L 1/16 (2006.01)
H01L 41/193 (2006.01)

(52) U.S. Cl.
CPC ............ *H01L 41/1132* (2013.01); *G01L 1/16* (2013.01); *H01L 41/193* (2013.01); *H01L 41/45* (2013.01)

(58) Field of Classification Search
CPC ..... H01L 41/45; H01L 41/082; H01L 41/083; H01L 41/193; H01L 41/1132; H01L 41/1137
See application file for complete search history.

(56) References Cited

U.S. PATENT DOCUMENTS

2013/0229091 A1* 9/2013 Yu .................. H01L 41/1132
                                                              310/367
2015/0280102 A1* 10/2015 Tajitsu .................. G01L 1/16
                                                              310/338

FOREIGN PATENT DOCUMENTS

KR   10-2006-0130732 A    12/2006
KR   10-2010-0016017 A    2/2010
KR      10-1322838 B1     10/2013
WO    WO-2014058077 A1 *  4/2014 .............. G01L 1/16

OTHER PUBLICATIONS

Tetsuo Yoshida et al., "Piezoelectricity of Poly(L-lactic Acid) Composite Film with Stereocomplex of Poly(L-lactide) and Poly(D-lactide)", Japanese Journal of Applied Physics 49 (2010) 09MC11.
D. Mandal et al., "Origin of Piezoelectricity in an Electrospun Poly (vinylidene fluoride-trifluoroethylene) Nanofiber Web-Based Nanogenerator and Nano-Pressure Sensor", Macromol. Rapid Commun., 2011, pp. 831-837, vol. 32.
H. Tsuji, "Poly(lactide) Stereocomplexes: Formation, Structure, Properties, Degradation, and Applications", Macromol. Biosci., 2005, pp. 569-597, vol. 5.
P. Zhang, et al., "Intermolecular ordering as the precursor for stereocomplex formation in the electrospun polylactide fibers", Polymer, 2015, pp. 221-227, vol. 60.
D. Mandal, et al., "Simple Synthesis of Palladium Nanoparticles, β-Phase Formation, and the Control of Chain and Dipole Orientations in Palladium-Doped Poly(vinylidene fluoride) Thin Films", American Chemical Society, Langmuir 2012, pp. 10310-10317, vol. 28.

* cited by examiner

*Primary Examiner* — Christopher M Rodd
(74) *Attorney, Agent, or Firm* — Revolution IP, PLLC

(57) ABSTRACT

Disclosed is a piezoelectric material including stereocomplex crystals of poly(D-lactic acid) (PDLA) and poly(L-lactic acid) (PLLA), wherein poly(D-lactic acid) and poly (L-lactic acid) are crystallized into a stereocomplex, thus exhibiting superior heat resistance and piezoelectric properties. This piezoelectric material, which is obtained using poly(lactic acid), can be produced at very low cost compared to when using PVDF, and is configured to include stereocomplex crystals of PDLA and PLLA and can thus manifest high thermal stability and piezoelectric properties, compared to when using conventional PLLA alone. Such a piezoelectric material can be efficiently utilized in a variety of fields in which low production cost, high processing temperature in the manufacturing process, or high-temperature stability of piezoelectric material products is required.

11 Claims, 19 Drawing Sheets

FIG.2
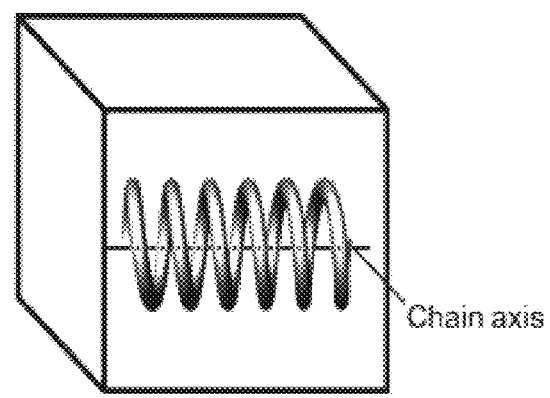
Deformation of helix
under shear stress
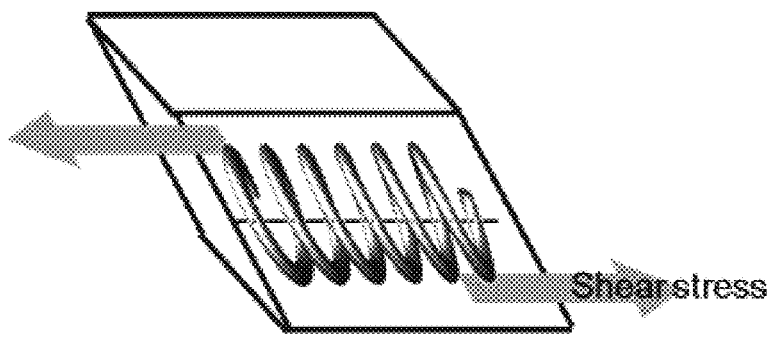

FIG.3A
FIG.3B
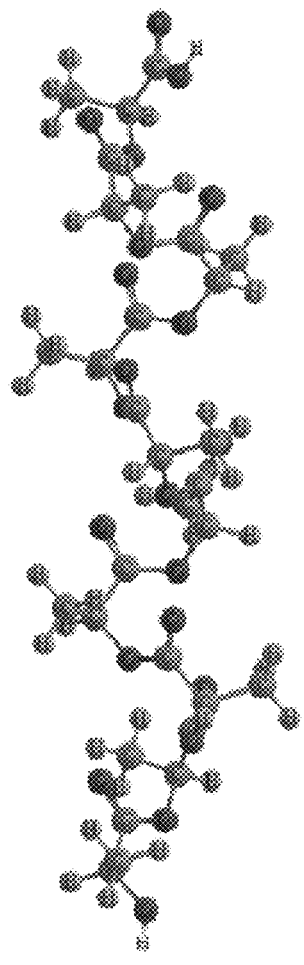
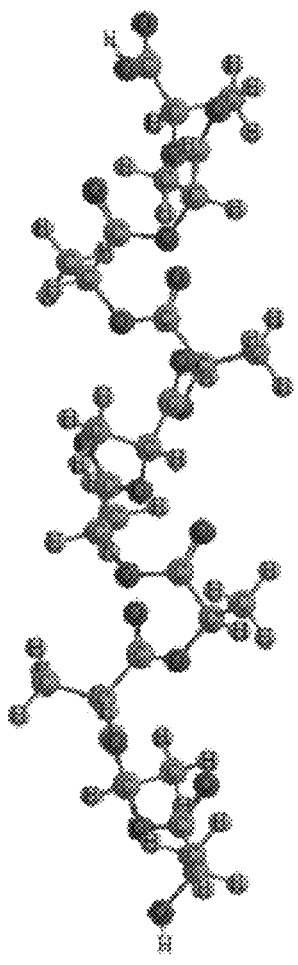
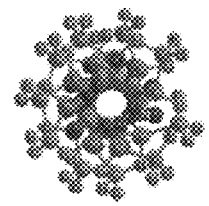
Mirror plane
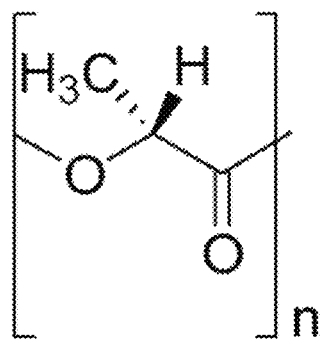
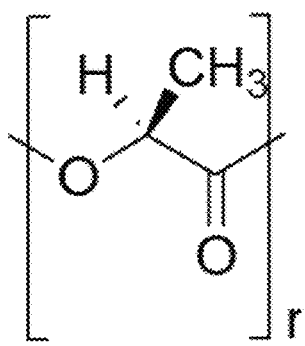
PLLA
PDLA FIG.7
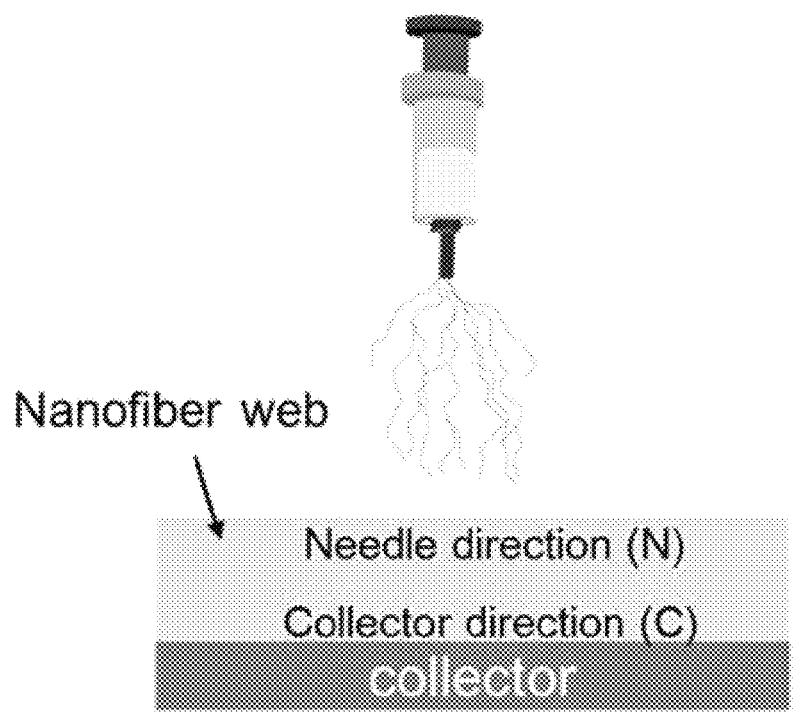
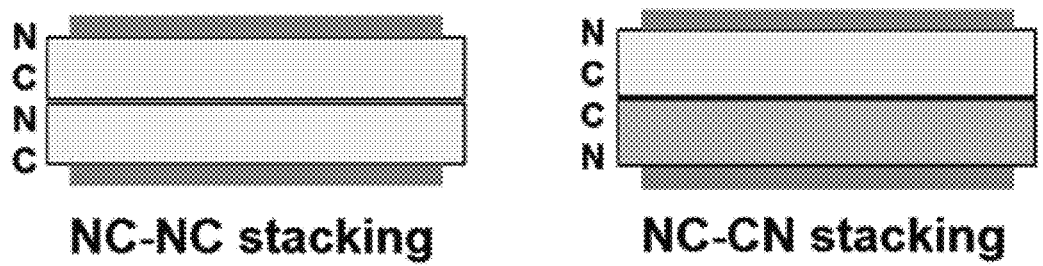
FIG.8
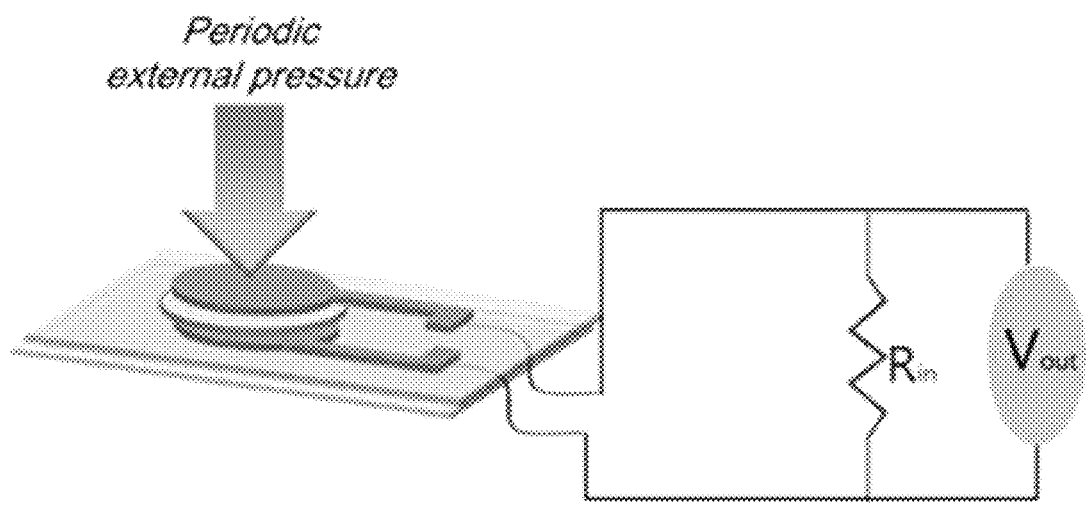

FIF.16A
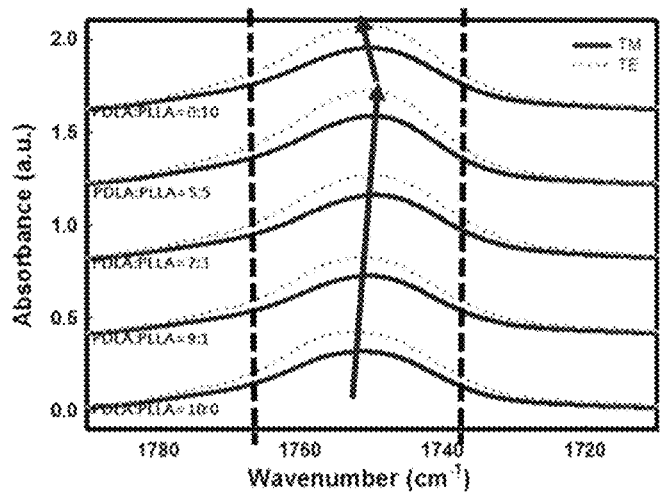
FIG.16B
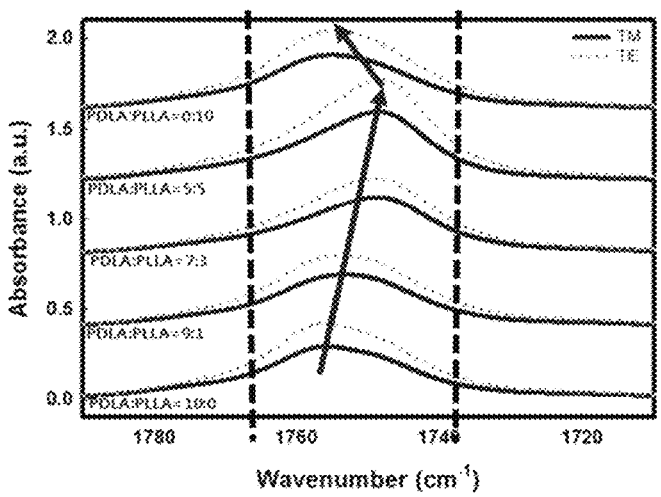
FIG.16C
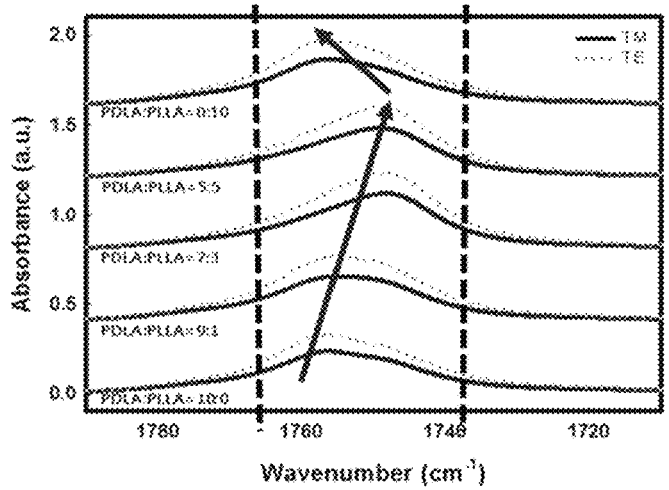

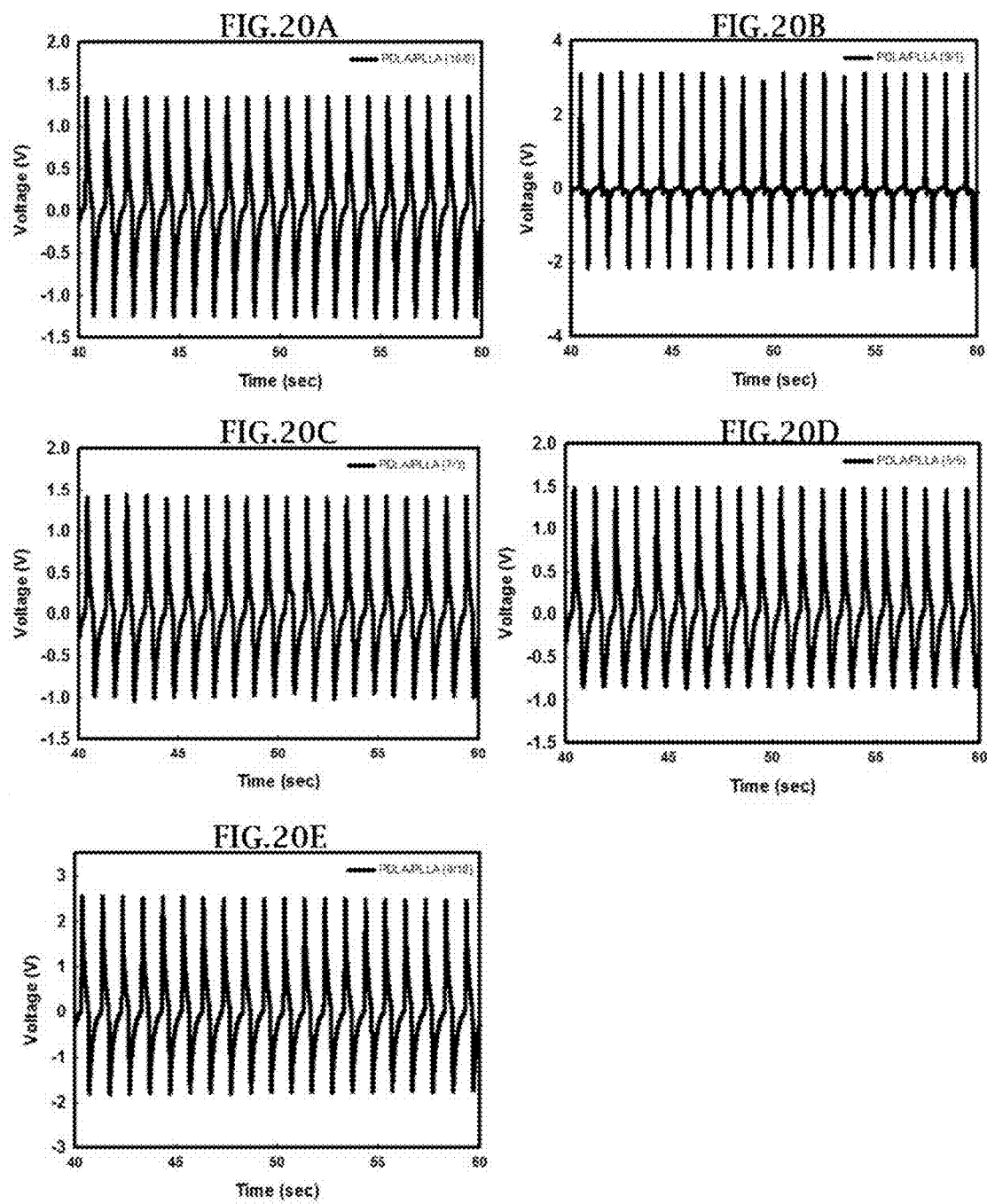

PIEZOELECTRIC MATERIAL COMPRISING POLY(D-LACTIC ACID)/POLY(L-LACTIC ACID) STEREOCOMPLEX CRYSTALS

CROSS REFERENCE TO RELATED APPLICATIONS

This application claims priority under 35 U.S.C. § 119 to Korean Patent Application No. 10-2015-0184053, filed on Dec. 22, 2015, which is hereby incorporated by reference in its entirety.

BACKGROUND

The present invention relates to a piezoelectric material comprising poly(D-lactic acid)/poly(L-lactic acid) stereocomplex crystals and, more particularly, to a piezoelectric material, which is configured such that poly(D-lactic acid) and poly(L-lactic acid) are crystallized into a stereocomplex to thus exhibit superior heat resistance and piezoelectric properties.

With the rapid spread of tablet personal computers and smart phones, the development of flexible wearable devices is required. For wearable devices, polymer-based soft sensors and actuators are being developed. A piezoelectric polymer and an electrospun nanofiber web, such as polyvinylidene fluoride (PVDF) and its copolymer (PVDF-TrFE)-based film, have been utilized in a variety of fields, including those of biomedical sensors, filters, energy production, etc. PVDF is known to exhibit superior piezoelectric properties, and has to possess a larger number of oriented C—F dipoles and to have a higher net dipole moment per unit area while increasing $\beta$-crystallization, in order to effectively serve as piezoelectric sensors, generators, and actuators.

Although PVDF advantageously manifests piezoelectric properties, PVDF-based wearable sensors are problematic due to the pyroelectric properties thereof. When they are touched by the hands or other body parts, it is impossible to distinguish whether the generated electric signals come from changes in the applied pressure or changes in body temperature. Also, many researchers have focused on finding low-cost and environmentally friendly materials to replace PVDF-based piezoelectric materials because of their high production costs and processing limitations. One promising candidate is polylactic acid (PLA). Compared to piezoelectric fluoropolymers, PLA is environmentally friendly, biodegradable, biocompatible, and economically advantageous. Additionally, an inexpensive PLA-based contact sensor is non-pyroelectric, shear-piezoelectric and non-aging, and may thus be effectively utilized in devices that come into close contact with the human body, unlike PVDF.

Over the past decade, the piezoelectric properties of PLA films have been studied by many researchers. Recently, PLA is receiving attention as a replacement for PVDF-based piezoelectric materials owing to the shear piezoelectric properties thereof. The shear piezoelectric properties of the PLA film are exhibited due to a chiral molecular structure having four different substituents (—O—, —COO—, —H and —CH$_3$) and a 3$_1$ helical chain structure, formed not through a polarization process but merely through a drawing process.

FIGS. 1A to 1D illustrate the easy conversion of the 10$_3$ helix ($\alpha$-crystalline form) into the 3$_1$ helix ($\beta$-crystalline form) due to the inherent helical molecular structure of the PLA drawn film. The $\alpha$-crystalline form is the most thermodynamically stable at room temperature, and may be easily obtained using a melting or solution-spinning process. However, an undrawn PLA film is configured such that the molecular chain is randomly oriented and C═O dipole groups are helically oriented along the molecular chain, and thus the net dipole moment is zero, resulting in the complete loss of piezoelectric properties. Such an $\alpha$-crystalline PLA film is converted into a $\beta$-crystalline conformation having a 3$_1$ helix only when subjected to uniaxial drawing at a high temperature and a high draw ratio. In this case, however, C═O dipoles are still helically oriented along the molecular chain, and thus the net dipole moment is also zero. Interestingly, when shear pressure is applied to the helical PLA molecule in the direction of a chain axis, the helix is modified through shear deformation effects, and piezoelectric current, referred to as "shear piezoelectricity," is produced due to non-zero polar changes (FIG. 2).

The PLA monomer (lactic acid) shows a chiral structure having asymmetrical carbon. Poly(L-lactic acid) (PLLA) and poly(D-lactic acid) (PDLA) are formed through polymerization of the monomers thereof, and respectively show left-hand and right-hand 10$_3$ helices (FIGS. 3A and 3B). The stereocomplex (SC) of PLLA and PDLA was first investigated in 1987, and the structures, properties, degradations and applications thereof have been researched since. When PLLA and PDLA are formed into a stereocomplex, the chains thereof are alternately aligned side by side to form a racemic structure (FIGS. 4A and 4B). SC-PLA exhibits superior mechanical properties, thermal stability and hydrolysis resistance compared to homocrystals of PDLA and PLLA. Such characteristics enable the operation of SC-PLA-based wearable devices at high operating temperatures under harsh environmental conditions. Tsuji has studied the formation of SC from a PDLA/PLLA blend through solution casting, and Zhang et al. have studied the formation of SC by electrospinning a mixed solution of PLLA and PDLA. The homocrystals are efficiently formed in the PLLA/PDLA blend molten quenched film, whereas SC is more easily formed by the high DC voltage that is applied during electrospinning.

The electrospinning process is simple but very effective at manufacturing a flexible nanofiber web-based piezo-active device. Mandal et al. have found the piezoelectric properties in P(VDF-TrFE), as well as the relationship between dipole orientations induced by electrospinning and piezoelectric properties. FIG. 5 shows dipoles induced in the P(VDF-TrFE) jet during electrospinning and under an electric field that is applied in the electrospinning process. In the electrospinning process, high DC voltage is applied to a syringe needle and a collector. The polymer solution, discharged through the syringe needle, is stretched in an electric field and is accumulated on a metal collector. Due to the effects of stretching together with the orientation of C—F dipoles, the $\beta$-crystallinity of P(VDF-TrFE) is increased compared to a film resulting from solution casting. Accordingly, as the nanofiber web is formed, flexibility is increased, and moreover, piezoelectric properties are enhanced. However, since the stretching effect is low in the electrospinning process, the $\beta$-crystal content of the electrospun nanofiber web is low compared to the stretched film.

When a PLA nanofiber web is manufactured through electrospinning, the inherent problems of PLA films, namely brittleness and inflexibility, may be solved. Recently, Lee et al. have investigated the shear piezoelectric properties of electrospun PLLA nanofiber webs. Based on the polarized ATR spectrum data, it was verified that stretching, crystallization and dipole orientation are induced due to high DC voltage in the electrospinning process, and thus the C═O functional group of PLLA is certainly oriented. The electrospun PLLA nanofiber web may be used for capacitive nano-generators and dynamic pressure sensors through appropriate manufacturing processes, including changes in nanofiber web stacking configurations or electrode structures. However, the shear piezoelectric properties of PDLA and PLLA-PDLA racemic mixed electrospun nanofiber webs have not yet been reported.

CITATION LIST

Patent Literature

Korean Patent No. 10-1322838

Non-Patent Literature (Non-Patent Document 1) D. Mandal, S. Yoon, and K. J. Kim, Macromol. Rapid Commun., 32, 831-837 (2011).
(Non-Patent Document 2) H. Tsuji, Macromol. Biosci., 5, 569-597 (2005).
(Non-Patent Document 3) P. Zhang, R. Tian, B. Na, R. Lv, and Q. Liu, Polymer, 60, 221-227 (2015).
(Non-Patent Document 4) D. Mandal, K. J. Kim, and J. S. Lee, Langmuir, 28, 10310-10317 (2012).

SUMMARY

Accordingly, the present invention has been made keeping in mind the problems encountered in the related art, and an objective of the present invention is to provide a novel piezoelectric material, which may exhibit superior heat resistance and piezoelectric properties compared to conventional PLA-based piezoelectric materials.

Another objective of the present invention is to provide a method of efficiently manufacturing the piezoelectric material having superior properties described as above.

An aspect of the present invention provides a piezoelectric material, comprising stereocomplex crystals of poly(D-lactic acid) (PDLA) and poly(L-lactic acid) (PLLA).

Lactic acid, which is a monomer for poly(lactic acid) (PLA), is an optical isomer comprising two types of isomer, namely D-isomer and L-isomer, and PLA, comprising the D-isomer, is referred to as PDLA, and PLA, comprising the L-isomer, is referred to as PLLA (FIGS. 3A and 3B).

When PDLA and PLLA are formed into a stereocomplex (SC-PLA), the chains thereof are alternately aligned side by side to form a racemic structure (FIGS. 4A and 4B). SC-PLA exhibits superior mechanical properties, thermal stability, and hydrolysis resistance, compared to homocrystals of PDLA and PLLA. Such characteristics enable the operation of PLA-based wearable devices at high operating temperatures and under harsh environmental conditions.

However, in the case where PDLA and PLLA, which are optical isomers, are formed into a stereocomplex, it is considered that all of the dipoles, including C=O dipoles, are oriented in opposite directions, and thus piezoelectric current generated by shear force is offset, whereby the remnant polarization is always zero regardless of the presence or absence of external force, resulting in the absence of piezoelectric properties.

The present inventors have experimentally discovered the fact that there is no difference in the magnitude and sign of piezoelectric signals of individual PDLA and PLLA electrospun nanofiber webs under the same external force, and also that piezoelectric properties in the electrospun PLA nanofiber web are affected by crystallinity as well as the orientation of C=O dipoles, and thereby the PDLA/PLLA stereocomplex may be expected to show piezoelectric properties.

Therefore, the PDLA/PLLA blend is electrospun into the nanofiber web, whereby stereocomplex crystals may be formed. Based on the analysis results of the properties of each sample thus prepared using attenuated total reflectance infrared spectroscopy (ATR-IR), differential scanning calorimetry (DSC), X-ray diffraction (XRD), and measurement of piezoelectricity, the PDLA/PLLA stereocomplex can be confirmed to exhibit superior piezoelectric properties and higher thermal stability.

In the piezoelectric material according to the present invention, the piezoelectric material is preferably a nanofiber web resulting from electrospinning a PDLA/PLLA blend resin composition. When the PDLA/PLLA blend is electrospun into a nanofiber web, the PDLA/PLLA stereocomplex crystals may be easily formed, and the C=O and C—O—C dipoles and/or molecular chains thereof may be oriented in a certain direction, thus exhibiting superior piezoelectric properties.

In the piezoelectric material according to the present invention, the blend resin composition is preferably composed of PDLA and PLLA, blended at a weight ratio ranging from 7:3 to 3:7, and more preferably from 6:4 to 4:6. Thereby, the PDLA/PLLA stereocomplex crystals may be more efficiently formed, and the melting point of the piezoelectric material may be elevated by about 50° C. due to the stereocomplex formation, thus increasing heat resistance.

In the piezoelectric material according to the present invention, the piezoelectric material is preferably obtained by annealing the nanofiber web at 60 to 190° C., and more preferably 80 to 160° C. Furthermore, the annealing is preferably carried out for a period of time ranging from 10 min to 24 hr. When the nanofiber web is formed through electrospinning and then annealing is performed under the above conditions, the non-crystallization region, which is not crystallized during the electrospinning, is crystallized through cold crystallization, and thus the stereocomplex crystals may be more efficiently formed. In particular, when the nanofiber web obtained by electrospinning PDLA and PLLA at a weight ratio of 6:4 to 4:6 is annealed at 110 to 130° C., the above effects and superior piezoelectric properties may be manifested.

Another aspect of the present invention provides a piezoelectric sensor, comprising the aforementioned piezoelectric material and electrodes.

A further aspect of the present invention provides a method of manufacturing the piezoelectric material, comprising: a) preparing a spinning solution by dissolving PDLA and PLLA in a solvent; and b) forming a nanofiber web by electrospinning the spinning solution.

In the method of manufacturing the piezoelectric material according to the present invention, PDLA and PLLA are preferably dissolved in the solvent at a weight ratio of 7:3 to 3:7, and more preferably a weight ratio of 6:4 to 4:6.

The method of manufacturing the piezoelectric material according to the present invention may further include c) annealing the nanofiber web at 60 to 190° C., after b). As such, the annealing temperature preferably falls in the range of 80 to 160° C.

In the method of manufacturing the piezoelectric material according to the present invention, the annealing may be performed for a period of time ranging from 10 min to 24 hr.

In the method of manufacturing the piezoelectric material according to the present invention, the solvent is preferably a mixed solvent comprising a first solvent selected from chloroform or tetrahydrofuran (THF) and a second solvent selected from among N,N-dimethylacetamide (DMAc), N,N-dimethylformamide (DMF), and dimethylsulfoxide (DMSO). The mixing ratio of the first solvent to the second solvent is preferably a volume ratio of 2:1 to 4:1, and PDLA and PLLA are preferably dissolved such that the combined weight thereof is set to 5 to 20 wt % of the weight of the spinning solution.

According to the present invention, the piezoelectric material is produced using PLA, and thus the production cost thereof is very low compared to when using PVDF. Furthermore, as the piezoelectric material contains PDLA/PLLA stereocomplex crystals, it can manifest superior thermal stability and piezoelectric properties compared to when using PLLA or PDLA alone. Therefore, such a piezoelectric material can be very efficiently utilized in a variety of fields in which low production cost, high processing temperature in the manufacturing process, or high-temperature stability of piezoelectric material products is required.

BRIEF DESCRIPTION OF THE DRAWINGS

The above and other objectives, features and advantages of the present invention will be more clearly understood from the following detailed description taken in conjunction with the accompanying drawings, in which:

FIG. 2 illustrates shear stress that is applied to the chain structure;

FIGS. 3A and 3B illustrate $10_3$ helices and repeating units of PLLA and PDLA, respectively;

FIG. 7 illustrates the elements for use in manufacturing a piezoelectric sensor and the stacking configurations (NC-NC and NC-CN);

FIG. 8 illustrates the equivalent circuit used to measure a piezoelectric signal;

FIGS. 16A to 16C illustrate the shift of a C=O peak in the ATR-IR spectrum of the PDLA/PLLA nanofiber webs, FIG. 16A showing the as-electrospun samples, FIG. 16B showing the samples annealed at 80° C. for 12 hr, and FIG. 16C showing the samples annealed at 120° C. for 12 hr;

FIGS. 20A to 20E illustrate the dynamic pressure test signals of the SC-PLA nanofiber webs electrospun at different PDLA/PLLA ratios and annealed at 80° C. for 12 hr, FIG. 20A showing 10/0, FIG. 20B showing 9/1, FIG. 20C showing 7/3, FIG. 20D showing 5/5, and FIG. 20E showing 0/10.

DETAILED DESCRIPTION

Figure 1A:
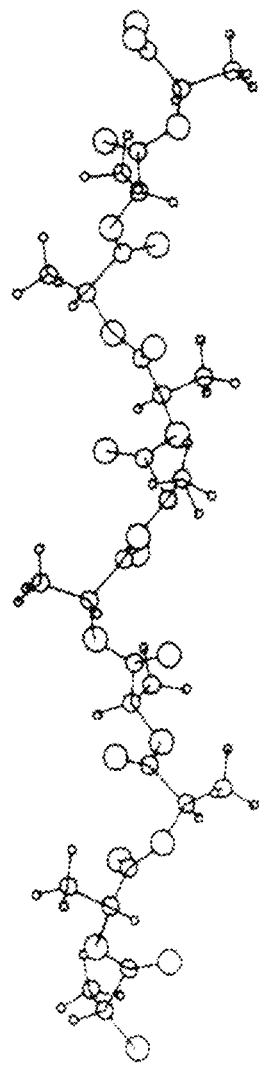
FIG. 1A illustrates a $10_3$ helical chain structure of PLLA.
Figure 1B:
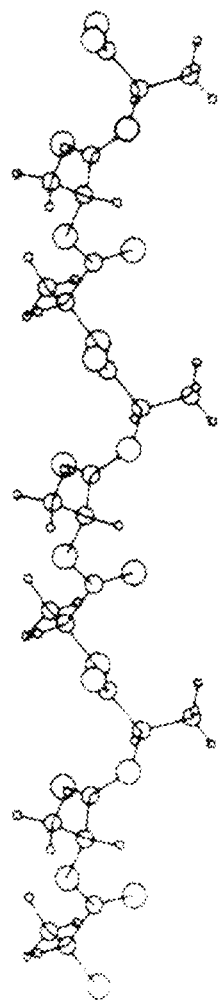
FIG. 1B illustrates a $3_1$ helical chain structure.
Figure 1C:
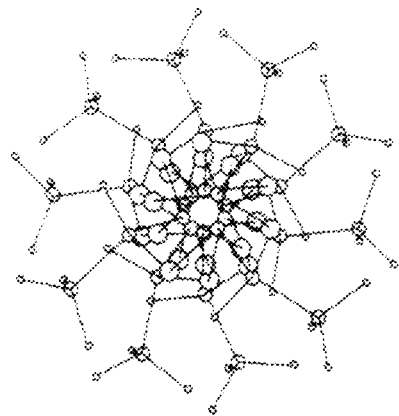
FIG. 1C illustrates the $10_3$ helical chain structure when viewed perpendicularly.
Figure 1D:
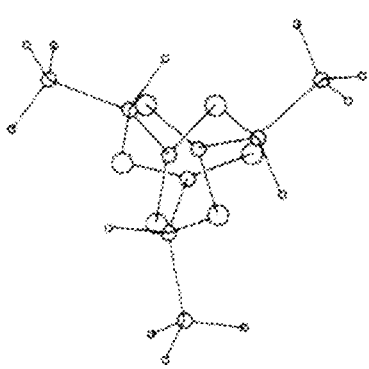
FIG. 1D illustrates the $3_1$ helical chain structure when viewed perpendicularly.
Figure 4A:
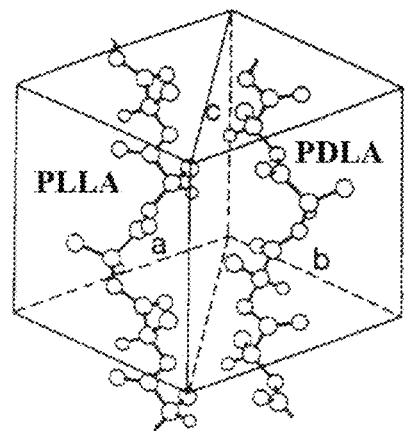
FIGS. 4A and 4B illustrate the $3_1$ helical crystal structures of SC-PLA, FIG. 4A (left: PLLA, right: PDLA) and FIG. 4B showing the structures when viewed perpendicular to the chain axis.
Figure 4B:
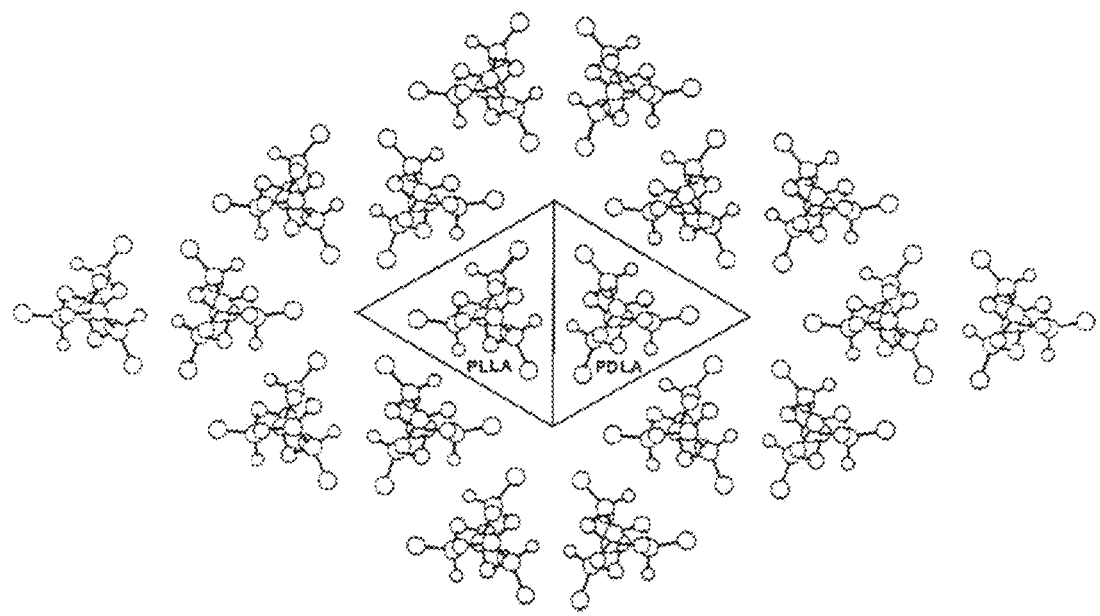
Figure 5:
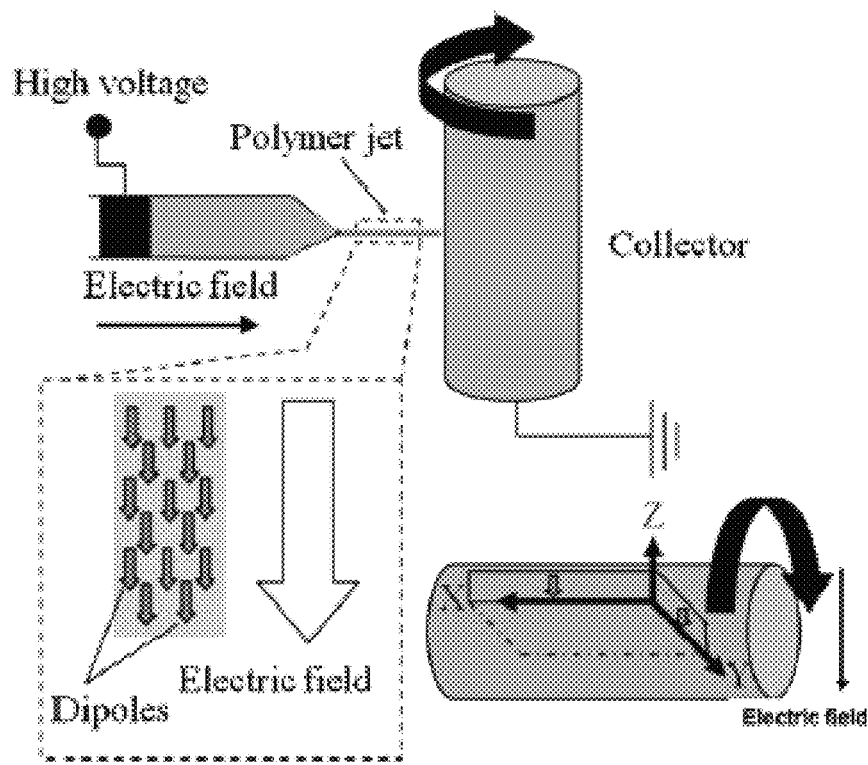
FIG. 5 illustrates the dipoles induced in the P(VDF-TrFE) polymer jet during and upon electrospinning.
Figure 6:
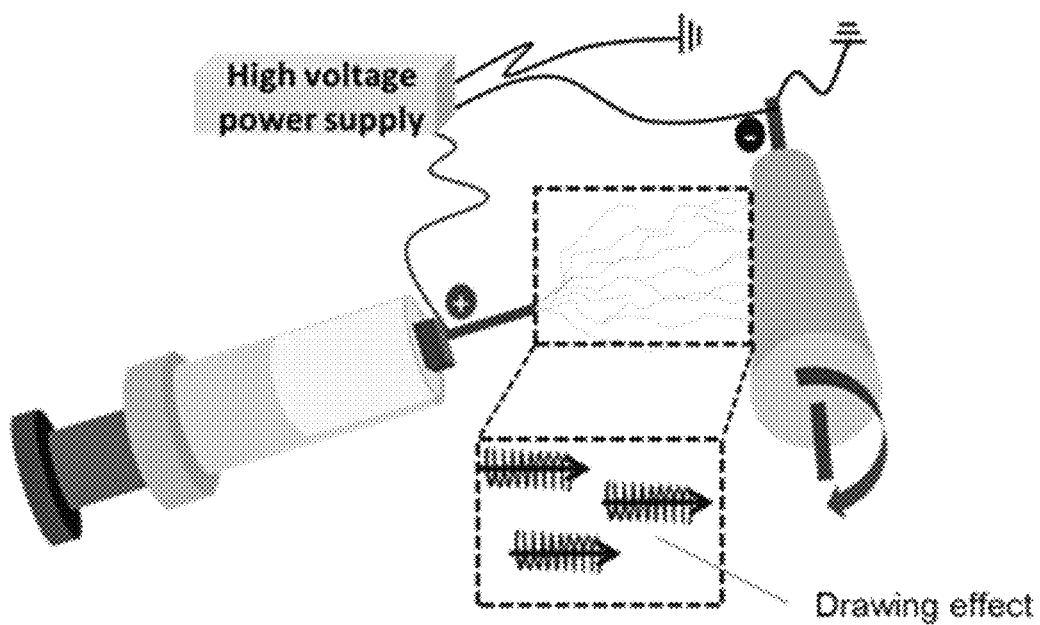
FIG. 6 illustrates the electrospinning of a PLLA electrospinning solution in which a $3_1$ helix is aligned by a drawing effect.

Hereinafter, a detailed description will be given to embodiments of the present invention. These embodiments are set forth to illustrate, but are not to be construed as limiting the scope of the present invention.

<Manufacture of Piezoelectric Material and Analysis of Properties Thereof>

1. Test Method 1-1. Materials

In this example, used were PDLA (PD-35, Mw=133,000 to 215,000), having an L-lactic acid content of less than 2%, available from Sino Biomaterials (China), PLLA (4032D, Mw=110,000), having a D-lactic acid content of about 2%, available from NatureWorks (USA), and PVDF (Kynar 761, Mw=370,000), available from Elf Atochem (Korea). Chloroform (CF), N,N-dimethylformamide (DMF) and acetone were purchased from Sigma-Aldrich (Korea) and used as the solvent for an electrospinning solution. Conductive adhesive Ni—Cu-plated polyester fabric (J.G. Korea Inc., Korea) was used for the upper and lower electrodes of a piezoelectric sensor.

1-2. Electrospinning

With stirring at room temperature, PLLA was dissolved in CF, to which DMF was then added, thus preparing a 9 wt % (w/v) PLLA electrospinning solution. As such, the ratio of CF to DMF was 3:1 (v/v). A 4 wt % (w/v) PDLA solution and 5 wt % (w/v) PDLA/PLLA blend solutions (9/1, 7/3 and 5/5 w/w) were prepared in the same manner. A PVDF electrospinning solution (12 wt % (w/v)) was prepared by dissolving PVDF in a mixed solvent of DMF and acetone (6:4). Here, DMF was used to solve some problems caused upon electrospinning using only the solution of PLA in CF. 6 to 7 ml of the PLA solution was placed in a syringe and was then electrospun under the following conditions: needle type 18G, a DC voltage of 12 to 14 kV, a supply rate of 2.0 to 2.8 ml/h, a tip-to-collector distance (TCD) of 8 cm, and a collector's rotational rate of 60 rpm. The PVDF was electrospun under the following conditions: needle type 23G, a DC voltage of 14 kV, a supply rate of 1.2 ml/h, a TCD of 10 cm, and a collector's rotational rate of 60 rpm.

In order to evaluate the thermal treatment effect, the manufactured nanofiber web samples were annealed in a vacuum at 80° C. and 120° C. for 12 hr.

1-3. Fabrication of Piezoelectric Sensor

In order to measure the piezoelectric output voltage of PLA and PVDF, piezoelectric sensors were fabricated using respective electrospun nanofiber webs. Adhesive conductive fabric was attached to each of both sides of a monolayer nanofiber web to form upper and lower electrodes, and changes in dipole orientation were measured depending on the PDLA/PLLA blend ratio and the annealing temperature. FIG. 7 illustrates the elements and configurations (NC-NC and NC-CN, wherein N indicates a needle direction, and C indicates a collector direction) of the piezoelectric sensor used for this invention. The upper and lower electrodes had a size of 3.14 $cm^2$, and were covered with transparent adhesive tape to maintain the configuration of the piezoelectric sensor.

1-4. Analysis

1-4-1. Field Emission-Scanning Electron Microscopy (FE-SEM)

In order to observe the surface morphology of the PDLA, PLLA and PDLA/PLLA blend nanofiber webs, an FE-SEM system (LEO SUPRA 55, Carl Zeiss Inc., USA) was used.

1-4-2. Attenuated Total Reflectance Infrared Spectroscopy (ATR-IR)

ATR-IR is useful for obtaining information about crystal structure, molecular chain/dipole orientation and molecular chain bond peak shift. Also, ATR-IR is used when measurement using another typical mode, such as a transmission IR mode or a grazing incident reflective light absorption mode, is impossible. In the present invention, ATR-IR was measured from averaging 100 scans collected at a resolution of 4 $cm^{-1}$ using an FTIR spectrophotometer (IFS 66V, Broker) with a diamond crystal accessory (GladiATR™, PIKE). The IR polarization direction suitable for TE (transverse electric) mode or TM (transverse magnetic) mode was selected before measurement, and measured ATR-IR data was recorded using OPUS software.

1-4-3. Differential Scanning Calorimetry (DSC)

The thermal properties of the PLA nanofiber web were analyzed at a heating rate of 10° C./min using DSC (Diamond DSC, PerkinElmer). The DSC system was used to analyze the cold crystallization temperature and the melting temperature of the sample.

1-4-4. X-ray Diffraction (XRD)

Using an X-ray diffractometer with a 2D detector diffraction system (D8 Discover with GADDS, Bruker AXS GmbH, Germany, Cu—$K_\alpha$ radiation), the 2D XRD pattern of the electrospun nanofiber web was measured in a transmission mode using Cu—$K_\alpha$ radiation ($\lambda$=0.154 nm), and scanned in an equatorial direction in the 2θ range of 5° to 27°, thus obtaining the graph of XRD intensity versus 2θ.

1-4-5. Measurement of Piezoelectricity

Using a self-manufactured dynamic air pressure device, external pressure (a pulse wave pressure of 1 kgf at a frequency of 1 Hz) was periodically applied to the sensor and the produced piezoelectric output signal was measured. The produced piezoelectric signal was detected in a voltage mode with $R_{in}$ of 1 GΩ and was stored in a PC through a NIDAQ board (FIG. 8).

2. Results

2-1. Signals of PDLA and PLLA Sensors

Figure 9A:
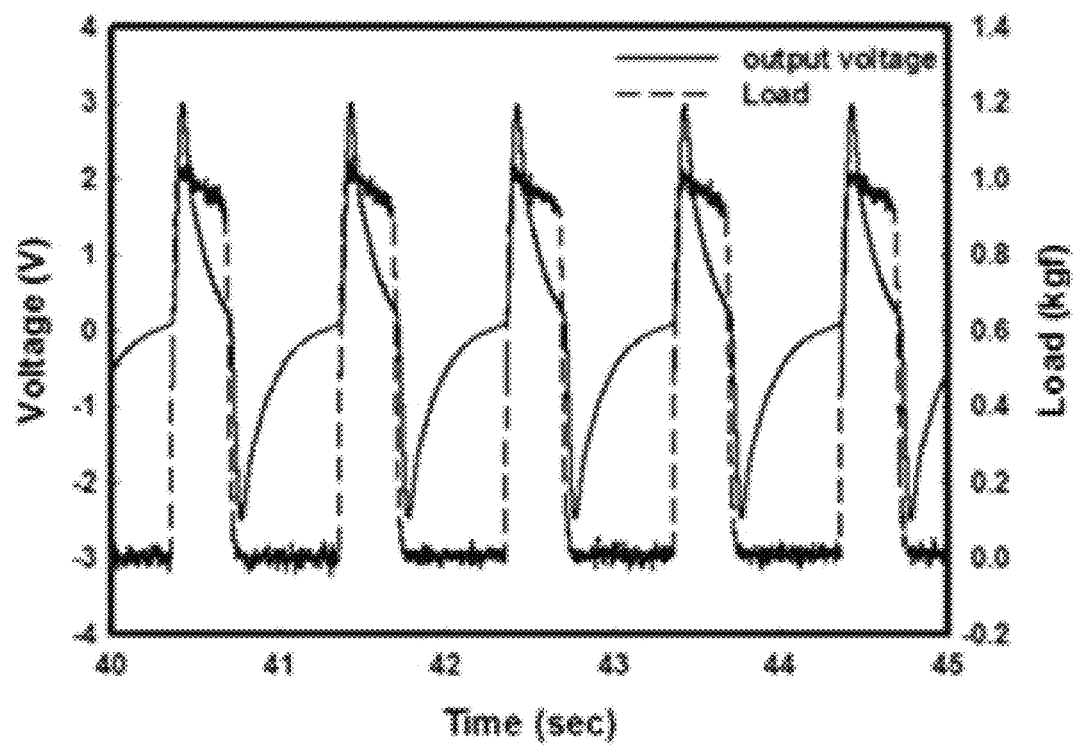
FIGS. 9A and 9B illustrate the piezoelectric output signals of respective PDLA and PLLA sensors.
Figure 9B:
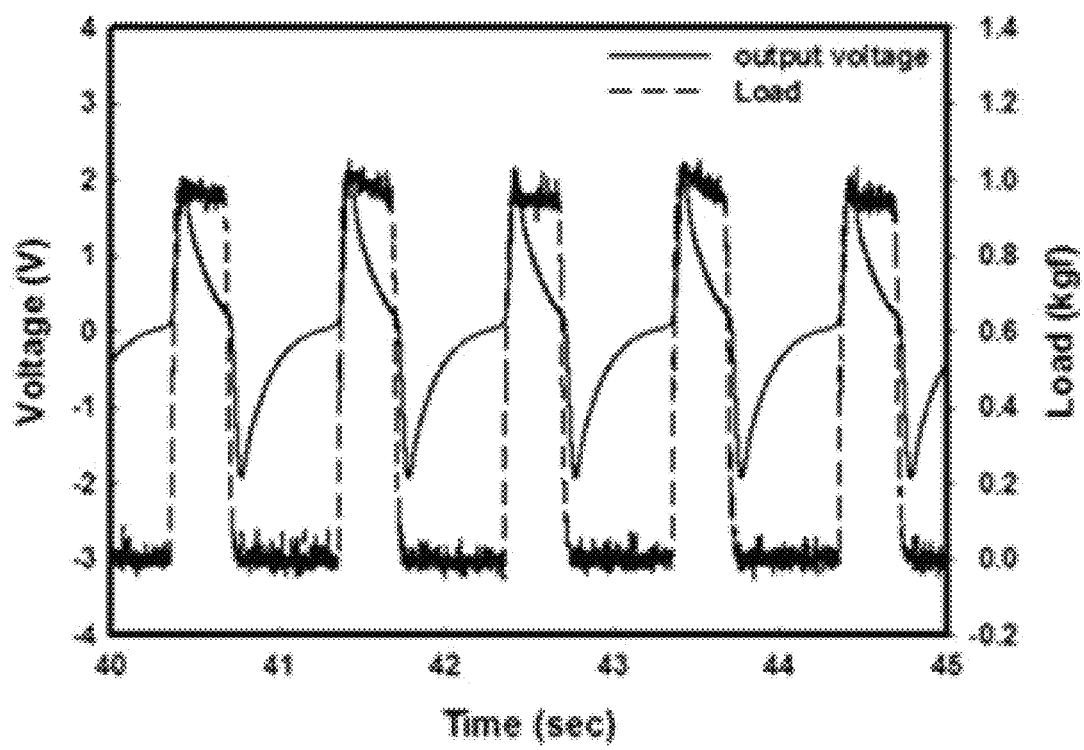

FIGS. 9A and 9B illustrate the piezoelectric output voltages and the applied pressure signals of respective PDLA and PLLA sensors. Both the two samples showed piezoelectric signals in the same direction despite the optical isomers. When pressure was applied in the same direction to the PDLA and PLLA sensors, individual sensors generated the signals in the (+) direction. When the pressure was removed, both the two sensors generated the signals in the (−) direction. Since the phenomenon in which similar electrical signals are generated in PLA nanofiber webs has not yet been reported, the above results are regarded as very meaningful. This is because C═O dipoles of PDLA and PLLA are partially oriented in the direction of an electric field at a high DC voltage, and thus the PLA helix is modified. Hence, the remnant polarization is no longer 'zero' after electrospinning, and both the PDLA and PLLA nanofiber webs show the same dipole orientation. However, $V_{p-p}$ (peak-to-peak voltage) of the PDLA sensor (5.2 V) is higher than that of the PLLA sensor (4.0 V), which is considered to be due to the difference in thickness, crystallinity, remnant polarization, etc.

Figure 10:
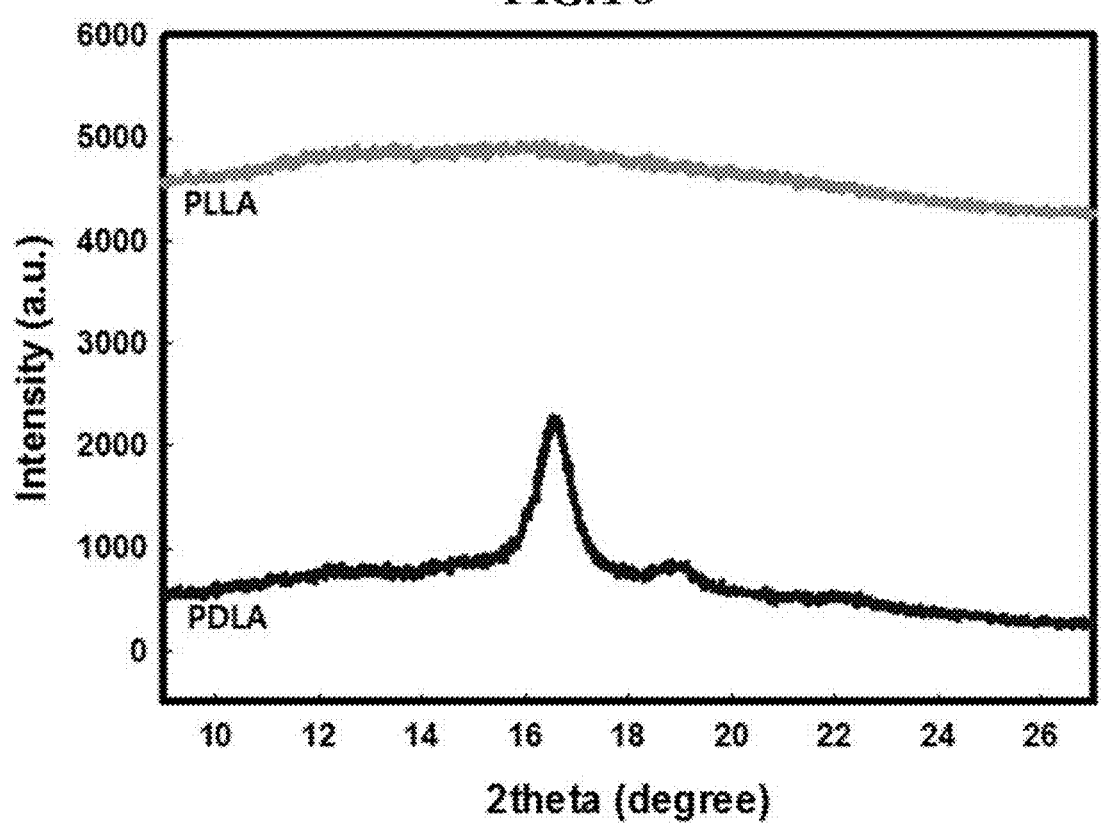
FIG. 10 illustrates an XRD graph of PDLA and PLLA electrospun nanofiber webs.

FIG. 10 illustrates an XRD graph for comparison of the crystallinities of the PDLA and PLLA nanofiber webs manufactured through electrospinning. Whereas PLLA did not show any crystallization diffraction peak, PDLA showed two obvious diffraction peaks at 2θ=16.3° and 2θ=18.6°, which means that the crystallinity of the PDLA sample is higher than that of the PLLA sample. The reason why there is a difference in the crystallinity is that the L-isomer content of the PDLA sample is lower than the D-isomer content of the PLLA sample. Therefore, the difference in piezoelectric output voltage between the PDLA and PLLA samples is considered to be due to the difference in crystallinity.

Figure 11A:
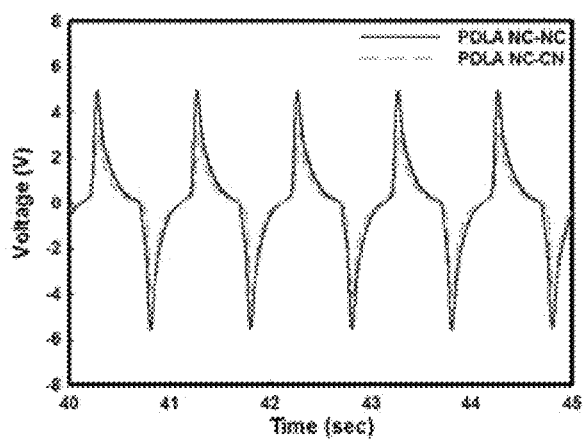
FIGS. 11A to 11D illustrate the piezoelectric output signals of PDLA and PLLA stacking sensors before annealing (FIGS. 11A and 11B) and after annealing at 120° C. for 12 hr (FIGS. 11C and 11D)
Figure 11B:
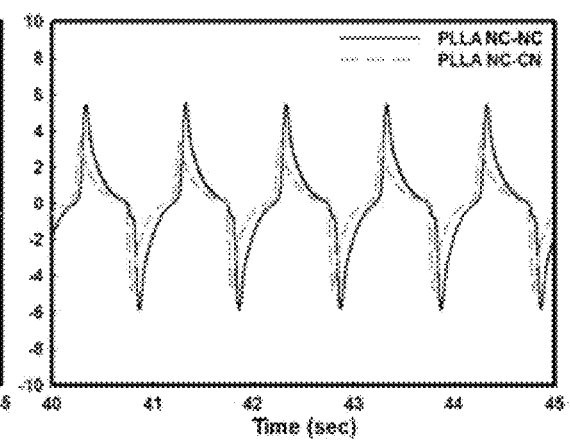

In order to determine whether the piezoelectric output of the PDLA and PLLA samples is caused by remnant polarization due to the partial orientation of C═O dipoles in the direction of an external electric field, by the inherent shear piezoelectricity able to generate current due to compressive deformation, or by the shear deformation of the helix due to the applied pressure, two piezoelectric sensors ((NC-NC) and (NC-CN)), in which the stacking configuration of the electrospun nanofiber web is changed, were manufactured, and the piezoelectric output signals thereof were measured (FIG. 11A and FIG. 11B). If the piezoelectric output voltage is manifested only by remnant polarization resulting from C═O dipoles being partially oriented under the high DC electric field during the electrospinning, based on the above analytical results for causes of the piezoelectric properties in the electrospun P(VDF-TrFE) [poly(vinylidene fluoride-trifluoroethylene)] nanofiber web, the NC-NC stacking sensor produces the strong output voltage that approximately doubles that of the monolayer sensor, and the NC-CN stacking sensor does not readily produce the output voltage. Although the NC-NC stacking sensor produced a strong output voltage that approximately doubles that of the monolayer sensor, the NC-CN stacking sensor showed an output signal that is weaker than the CN—CN but is still strong.

This means that the piezoelectric output voltage may be caused by changes in polarity due to the oriented C=O dipoles, compressive deformation, and/or shear deformation of the helix by pressure.

Figure 11C:
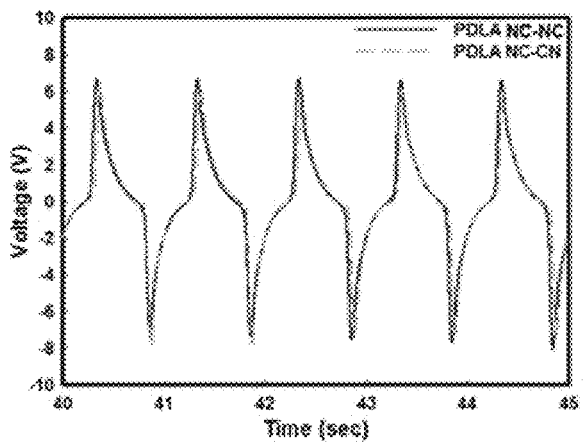
Figure 11D:
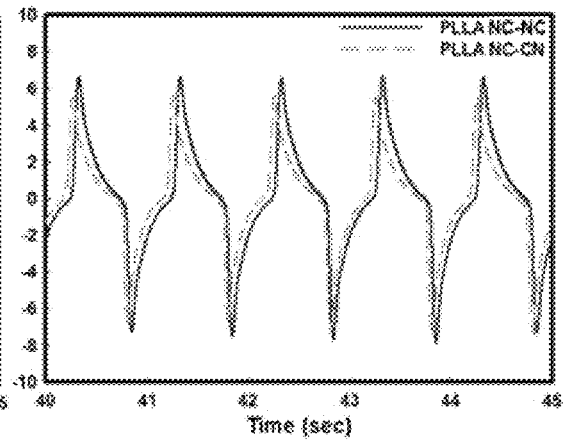
Figure 12A:
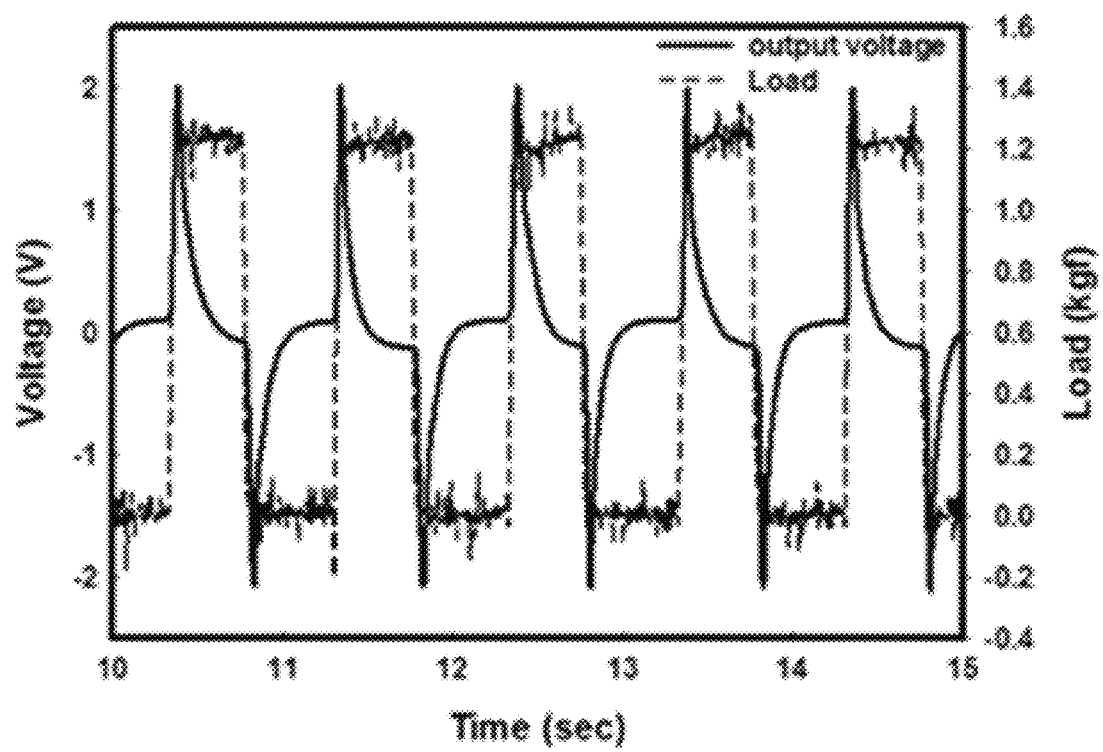
FIGS. 12A and 12B illustrate the piezoelectric output signals of the PVDF sensor before annealing and after annealing at 120° C. for 12 hr, respectively.
Figure 12B:
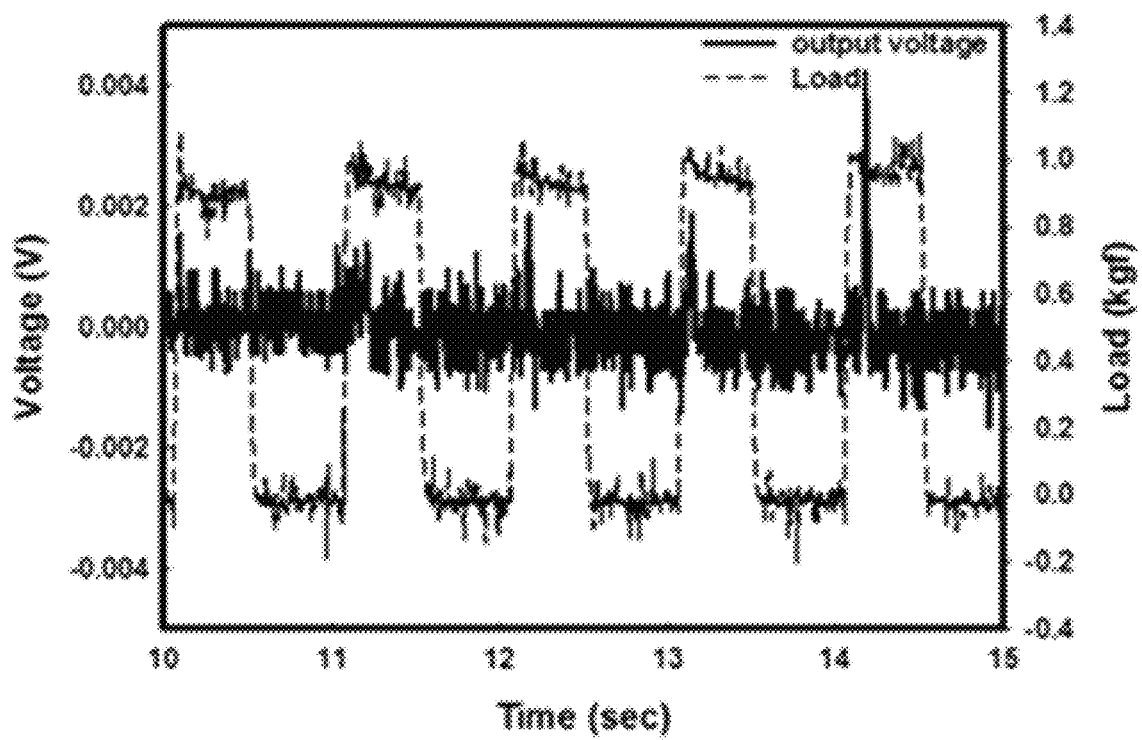
Figure 13A:
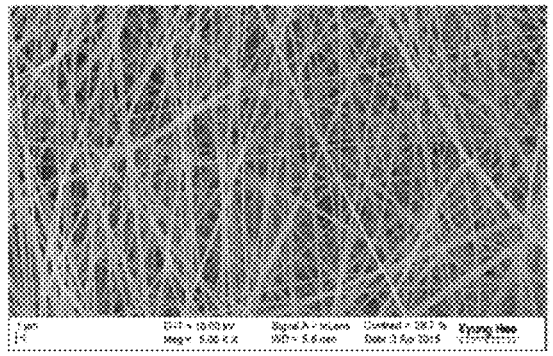
FIGS. 13A to 13E illustrate field emission-scanning electron microscopy (FE-SEM) images of the nanofiber webs manufactured at different PDLA/PLLA ratios (5000× magnified), FIG. 13A showing 10/0, FIG. 13B showing 9/1, FIG. 13C showing 7/3, FIG. 13D showing 5/5, and FIG. 13E showing 0/10.
Figure 13B:
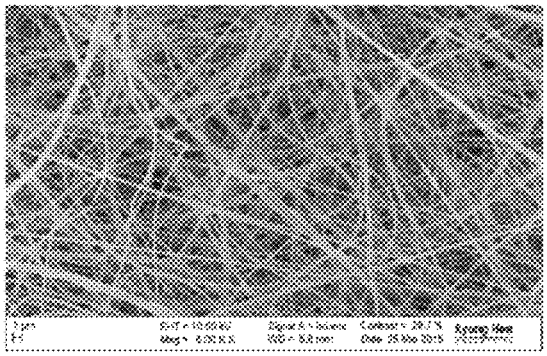
Figure 13C:
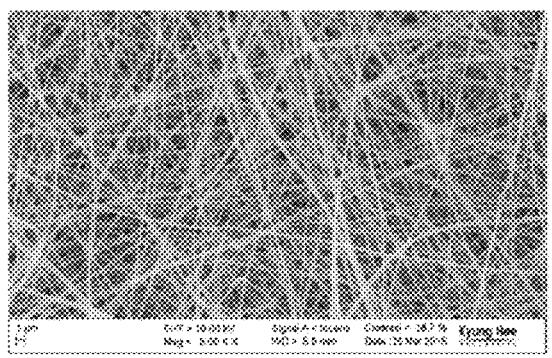
Figure 13D:
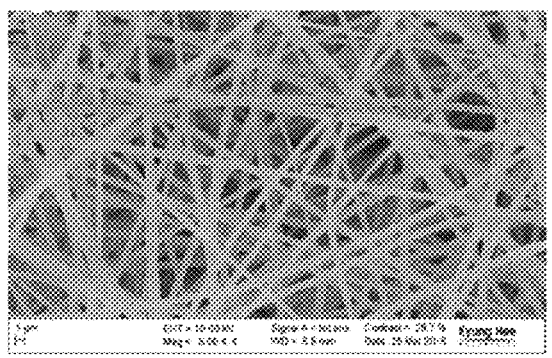
Figure 13E:
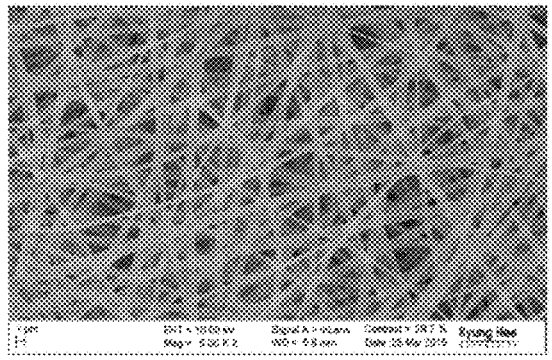

After measurement of the piezoelectric output of the electrospun PLA nanofiber web sensor, the nanofiber web was annealed at 120° C. for 12 hr in a vacuum oven in order to increase crystallinity and randomize the orientation of C=O dipoles. As for the annealed sample, C=O dipoles were randomly oriented through the annealing process but both of the PDLA and PLLA exhibited almost the same piezoelectric signal in the NC-NC and NC-CN stacking sensors, and high output voltage signals were generated, compared to the non-annealed sample (FIGS. 11C and 11D). These results may be explained by the fact that C=O dipoles were randomized due to thermal energy and thus remnant polarization does not exist anymore, the fact that the helix that was unstably deformed due to high DC voltage during the electrospinning was converted into an original stable helix, and the fact that crystallinity was significantly increased. In contrast, as illustrated in FIGS. 12A and 12B, the PVDF nanofiber web sensor that does not exhibit shear piezoelectric properties, like PLA, did not show any piezoelectric signal after annealing (120° C., 12 hr), because the orientation of CF dipoles was randomized by thermal energy during the annealing.

Based on these results, the present inventors have paid attention to PDLA and PLLA, which are optical isomers but in which there is no difference in piezoelectric signals between PDLA and PLLA nanofiber webs, and also to the electrospun PLA nanofiber web, the piezoelectric properties of which are affected by both the orientation of C=O dipoles and crystallinity. Furthermore, the PLA nanofiber web was determined to be a promising candidate for fabricating a heat-resistant piezoelectric sensor, unlike the PVDF nanofiber web.

2-2. PDLA/PLLA Blend Nanofiber Web-Based Piezoelectric Sensor 2-2-1. Morphological Analysis High DC voltage was applied in the electrospinning process, whereby a nanofiber web having a superior diameter scale from μm to nm was fabricated. A uniform morphology was determined depending on the electrospinning conditions including needle diameter, DC voltage used, TCD, concentration of the polymer solution, collector's rotational rate, solvent and relative humidity. FIGS. 13A to 13E illustrate FE-SEM images (5000×) of the PDLA/PLLA blend nanofiber webs. Nanofibers having a uniform diameter of 1 μm or less without a bead structure, regardless of the SC (stereocomplex)-PLA structure, were observed, which means that efficient and optimal electrospinning conditions were applied in this invention.

2-2-2. ATR-IR

Figure 14:
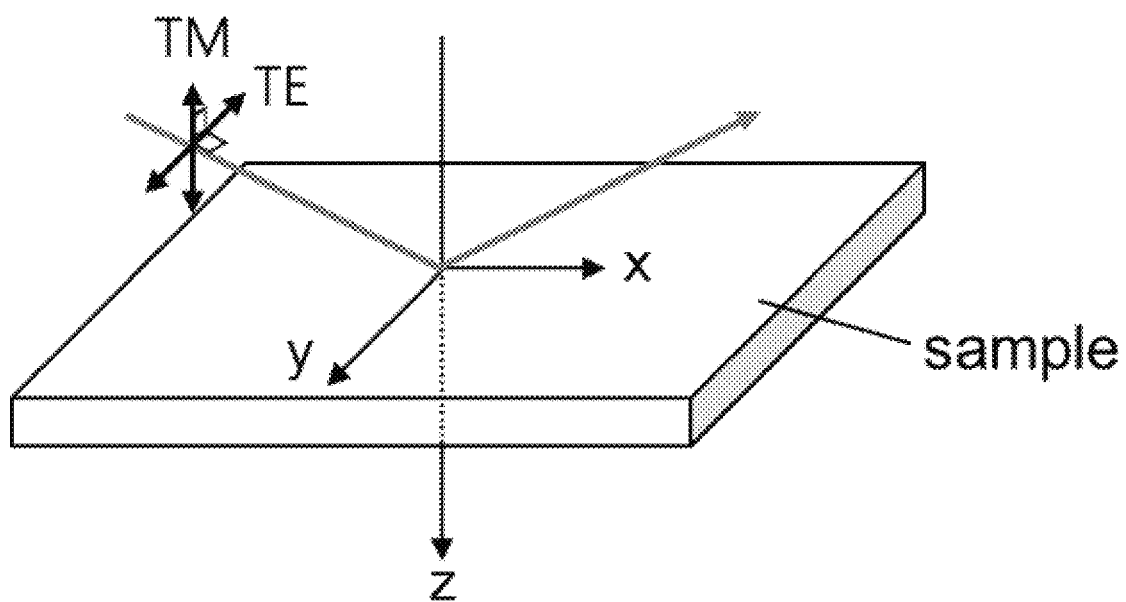
FIG. 14 illustrates the TM and TE, polarization for ATR-IR dichroism.

FIG. 14 schematically illustrates two polarized IR transmission waves (TM and TE modes) and three spatial axes (x, y and z), which are widely used for the nanofiber web sample. The polarization electric field direction of the TM wave is parallel to the transmission surface, but the polarization electric field direction of the TE wave is parallel to the surface of the sample. Meanwhile, the spectrum measured in TM and TE modes is sensitive to dichroism due to molecular orientation and optical contact between the crystal and the surface of the sample used for ATR-IR. In addition to the sensitivity to dichroism, ATR-IR is sensitive to the effective penetration depth $(d_e/\lambda_1)$ of the TM and TE, waves, as in Equations (1) and (2). Here, n is the ratio $(\eta_{material}/\eta_{crystal})$ of the refractive index of the material to the refractive index of the crystal used for ATR measurement, $\lambda_1$ is the wavelength $(\lambda_1=\lambda/\eta_{crystal})$ of transmitted IR radiation within the crystal, and θ is the transmission angle.

The effective penetration depth $(d_e/\lambda_1)$ of the TE or TM wave of the isotropic material was determined using Equations (1) and (2) below.

$$\frac{d_e(TE)}{\lambda_1} = \frac{n\cos\theta}{\pi(1-n^2)(\sin^2\theta - n^2)^{1/2}} \quad (1)$$

$$\frac{d_e(TM)}{\lambda_1} = \frac{n\cos\theta(2\sin\theta - n^2)}{\pi(1-n^2)[(1+n^2)\sin^2\theta - n^2](\sin^2\theta - n^2)^{1/2}} \quad (2)$$

The loss of reflective energy is minimized at a transmission angle of 45°. At this angle, the effective depth of the TM wave is greater than that of the TE wave, and the $d_e(TM)/d_e(TE)$ ratio of the isotropic polymer sample (dipoles in a random orientation) in an ideal contact state between the surface of the ATR crystal and the surface of the sample is theoretically 2. Specifically, the randomly oriented polymer chain theoretically shows that the absorption spectrum $(A_{TM})$ in the TM mode is two times as strong as the absorption spectrum $(A_{TE})$ in the TE mode, whereas the polymer chain having dipoles oriented in an electric field direction shows an $A_{TM}/A_{TE}$ ratio much lower than 2, or lower than 1.

The electrospun nanofiber web is understood to be randomly oriented in the x- and y-axis directions. In this invention, ATR-IR is used to analyze the drawing and poling effect of electrospinning associated with the molecular chain orientation in the nanofiber direction of the nanofiber web and the orientation of C=O dipoles in an electric field direction. Also, differences between the intermolecular chain interactions of the PDLA/PLLA and stereocomplex nanofiber webs thereof were investigated.

Figure 15A:
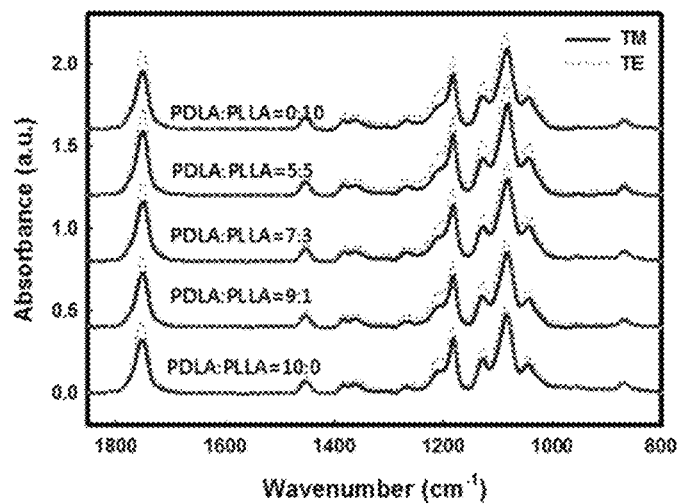
FIGS. 15A to 15C illustrate the ATR-IR spectra of the electrospun PDLA/PLLA nanofiber web samples, FIG. 15A showing the as-electrospun samples, FIG. 15B showing the samples annealed at 80° C. for 12 hr, and FIG. 15C showing the samples annealed at 120° C. for 12 hr.
Figure 15B:
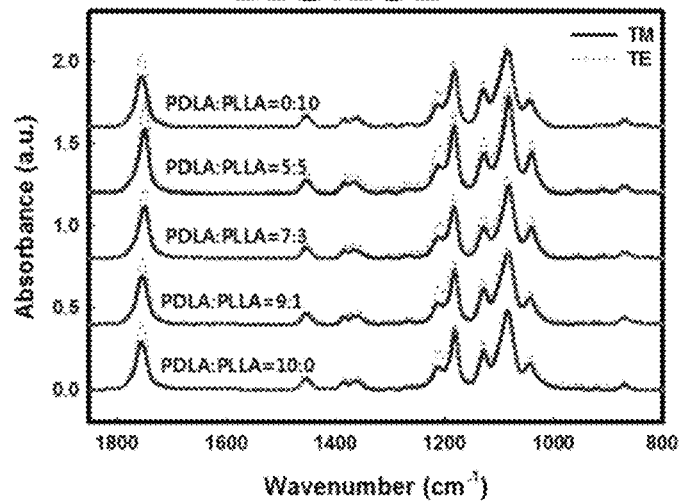
Figure 15C:
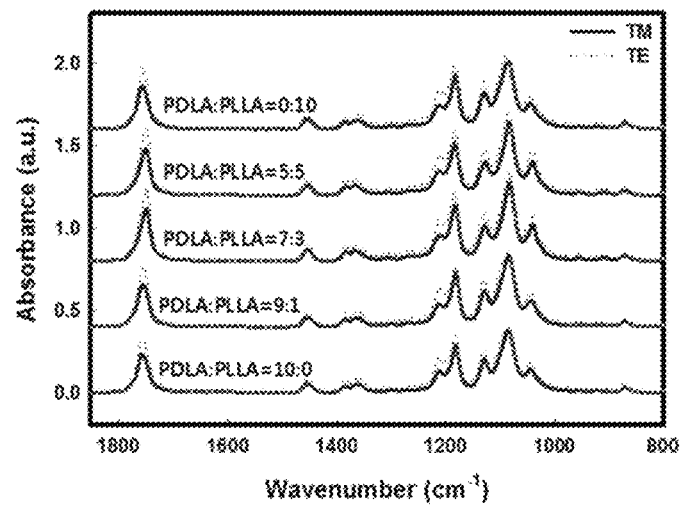

As illustrated in FIGS. 15A to 15C, the $A_{TE}$ was rather greater than $A_{TM}$ in the entire wavenumber range, regardless of the PDLA/PLLA blend composition. This is deemed to be because the electrospun nanofiber web may exhibit the orientation of C=O and C—O—C dipoles and/or the chain orientation, even without the annealing conditions, due to the application of the high electric field during the electrospinning, unlike the random orientation in the isotropic material obtained through solution casting.

More specifically, the shift of ν(C=O) peak (1751 cm$^{-1}$) was observed. FIG. 16A illustrates the shift of the ν(C=O) peak to as low a frequency as about 1 to 2 cm$^{-1}$ with an increase in the amount of PLLA in the PDLA/PLLA blend (electrospinning conditions). This is considered to be because some CH$_3$ . . . O=C hydrogen bonds are formed between the PDLA/PLLA chains in the SC-PLA. The optical isomerism of PDLA and PLLA is proven by the position (1751 cm$^{-1}$) of the ν(C=O) peak similar thereto. FIGS. 16B and 16C illustrate the shift of the C=O peak to the low frequency range by a wider width with an increase in the annealing temperature, in which SC-PLA is more efficiently formed by annealing compared to the electrospinning conditions.

2-2-3. DSC

Figure 17A:
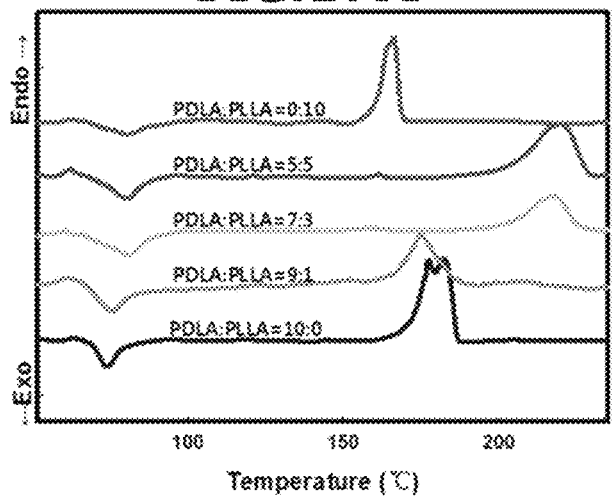
FIGS. 17A to 17C illustrate the DSC thermal curves of the PDLA/PLLA nanofiber webs, FIG. 17A showing the as-electrospun samples, FIG. 17B showing the samples annealed at 80° C. for 12 hr, and FIG. 17C showing the samples annealed at 120° C. for 12 hr.
Figure 17B:
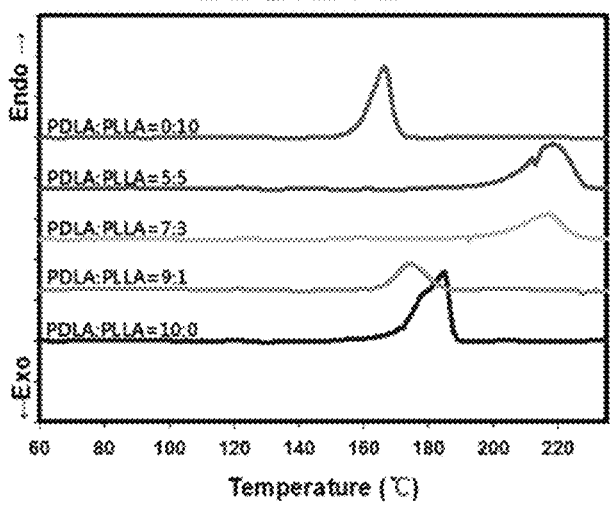
Figure 17C:
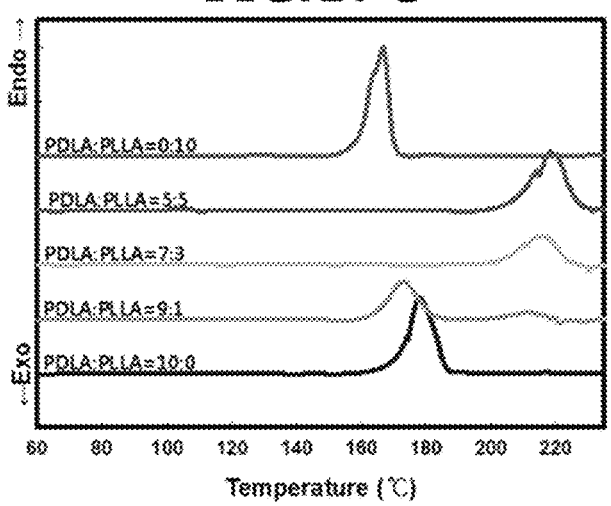

FIGS. 17A to 17C illustrate DSC graphs of the homo-PLA nanofiber webs and PDLA/PLLA blend nanofiber webs before and after annealing (annealing condition: 80° C. and 120° C. for 12 hr). In each as-electrospun sample, the presence of exothermic curve corresponding to the cold crystallization region in the heating process is detected. The melting point of the PDLA alone is 7 to 12° C. higher than that of the PLLA alone without respect to annealing. As described in the difference in the XRD peaks of the electrospun PDLA and PLLA nanofiber webs, it is related with the fact that the L-isomer content of the PDLA sample is lower than the D-isomer content of the PLLA sample. The exothermic peak was observed at about 80° C. in the electrospun nanofiber web (FIG. 17A), which means that cold crystallization occurs while thermal energy is transferred to the sample upon heating at the rate of 10° C./min in the non-crystallization region which is not crystallized due to rapid evaporation of the solvent during the electrospinning. In the PDLA or PLLA nanofiber web, the melting curves of the PLA homocrystals present initially and the PLA homocrystals produced through cold crystallization during the heating process were shown at about 175±5° C. In comparison, in the nanofiber webs comprising PDLA/PLLA blends at 7/3 and 5/5, the melting curves of the SC crystals present initially and the SC crystals produced through cold crystallization during the heating process were shown at about 225±5° C., which is about 50° C. higher than the melting point of the homocrystals of PLLA and PDLA. In the nanofiber webs resulting from electrospinning the PDLA/PLLA blend solutions at 7/3 and 5/5, the homocrystals of PLLA or PDLA were not formed and the SC crystals were selectively produced. This is because it is easy to produce a $3_1$ helix due to the drawing effect of a high DC electric field, which is applied upon electrospinning, and also because the close contact of PDLA-PLLA is further facilitated by induced dipoles, whereby the distance of $CH_3 \ldots O=C$ when PDLA-PLLA are adjacent to each other is much closer than the distance of $CH_3 \ldots O=C$ between the polymer chains in the case of adjacent PDLA-PDLA or PLLA-PLLA. Hence, since a $3_1$ helical PDLA/PLLA stereocomplex is more stable from a thermodynamic point of view, the production of SC-PLA crystal nuclei is easier than the production of homocrystal nuclei of PDLA or PLLA. Accordingly, only the melting peak at 225±5° C. is observed in the DSC thermal curves of the nanofiber webs electrospun from the PDLA/PLLA blends at 7/3 and 5/5.

The annealing effects were evaluated based on the heated DSC curves of the samples, in which the homo-PLA nanofiber webs and the SC-PLA nanofiber webs were annealed at 80° C. and 120° C. for 12 hr (FIGS. 17B and 17C). No cold crystallization peak appeared in any of the annealed samples, and only the melting peak of SC-PLA was observed for the samples comprising PDLA/PLLA blends at 7/3 and 5/5. When annealing was performed at 120° C. for 12 hr, the weak melting peak of SC-PLA was observed together with the main melting peak of PDLA even in the sample comprising the PDLA/PLLA blend at 9/1. The SC-PLA crystal structure was analyzed in greater detail through XRD, described below.

2-2-4. XRD

Figure 18A:
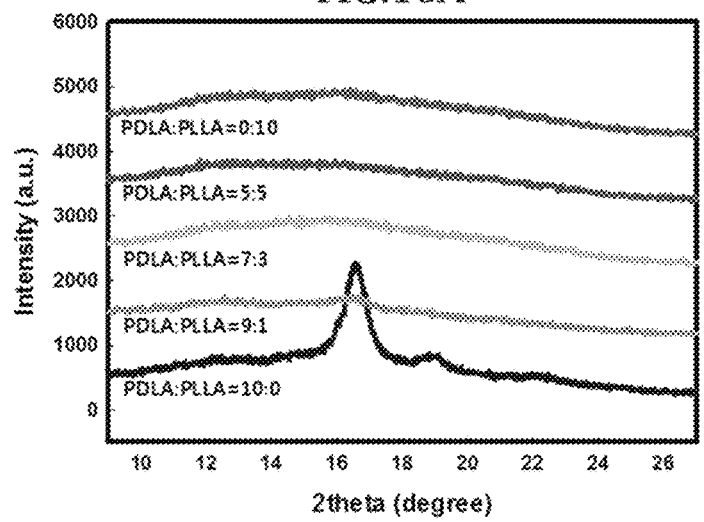
FIGS. 18A to 18C illustrate the XRD profiles of the PDLA/PLLA nanofiber webs, FIG. 18A showing the as-electrospun samples, FIG. 18B showing the samples annealed at 80° C. for 12 hr, and FIG. 18C showing the samples annealed at 120° C. for 12 hr.
Figure 18B:
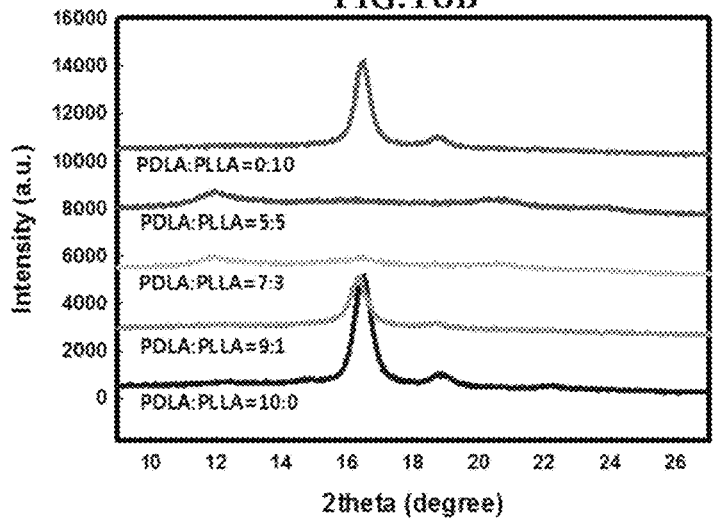
Figure 18C:
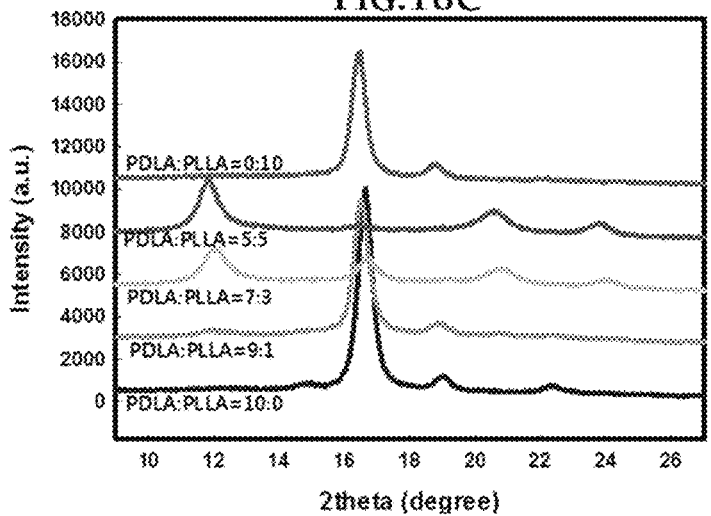
Figure 19A:
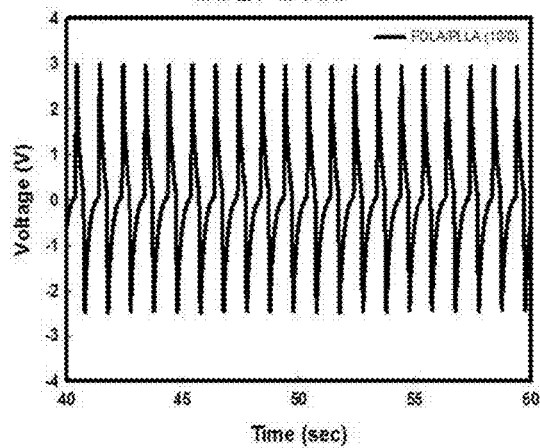
FIGS. 19A to 19E illustrate the dynamic pressure test signals of the SC-PLA nanofiber webs electrospun at different PDLA/PLLA ratios, FIG. 19A showing 10/0, FIG. 19B showing 9/1, FIG. 19C showing 7/3, FIG. 19D showing 5/5, and FIG. 19E showing 0/10.
Figure 19B:
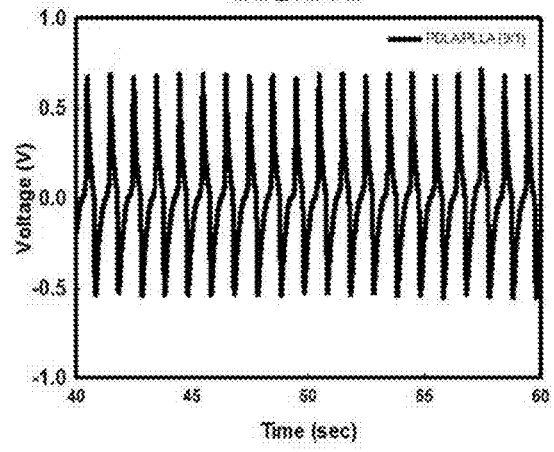
Figure 19C:
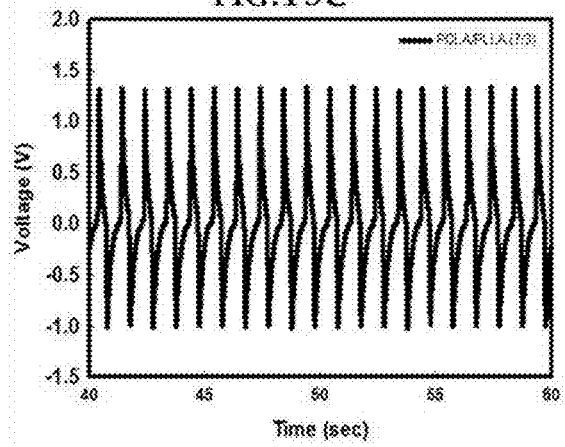
Figure 19D:
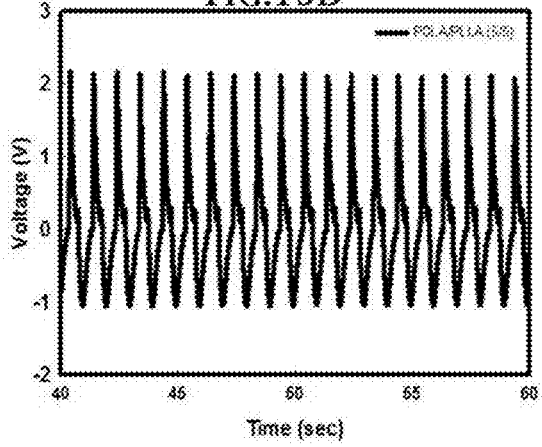
Figure 19E:
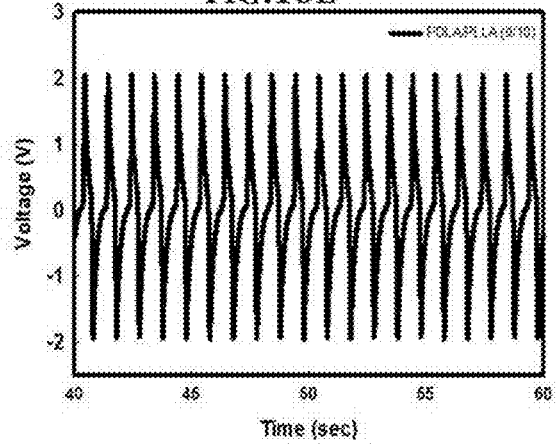
Figure 21A:
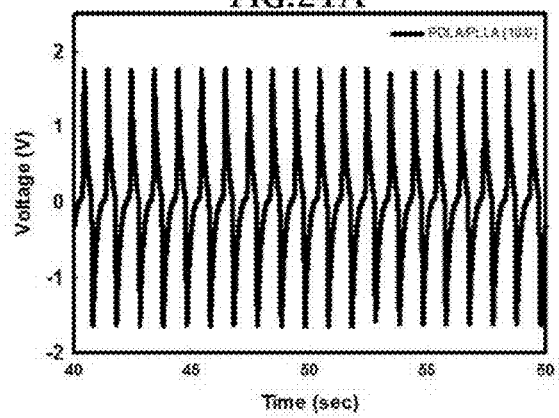
FIGS. 21A to 21E illustrate the dynamic pressure test signals of the SC-PLA nanofiber webs electrospun at different PDLA/PLLA ratios and annealed at 120° C. for 12 hr, FIG. 21A showing 10/0, FIG. 21B showing 9/1, FIG. 21C showing 7/3, FIG. 21D showing 5/5, and FIG. 21E showing 0/10.
Figure 21B:
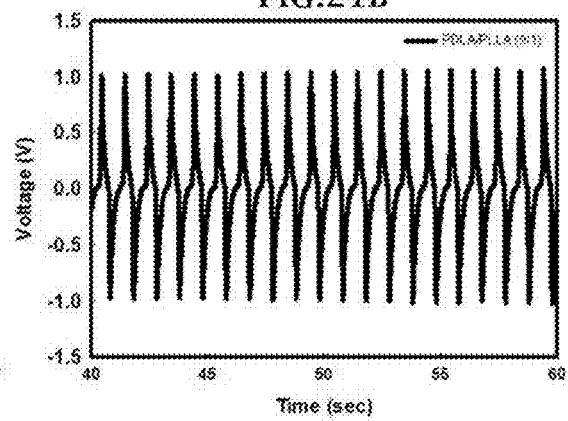
Figure 21C:
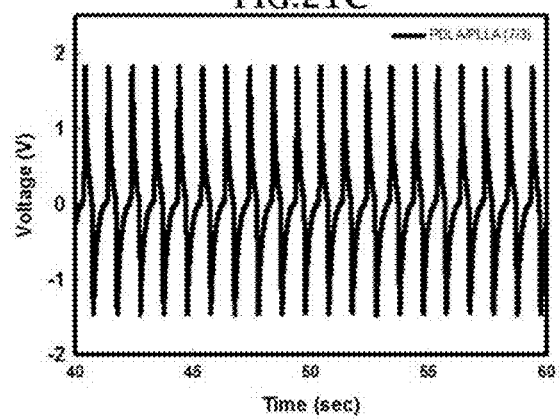
Figure 21D:
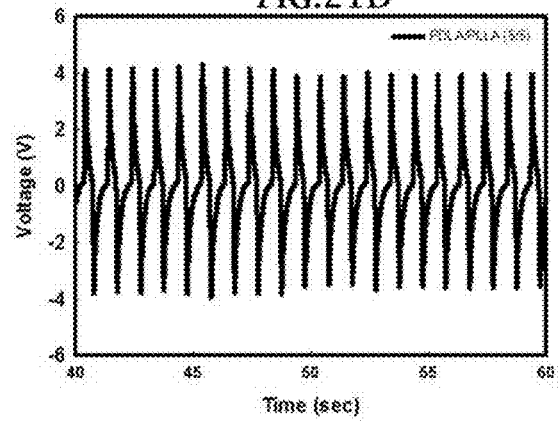
Figure 21E:
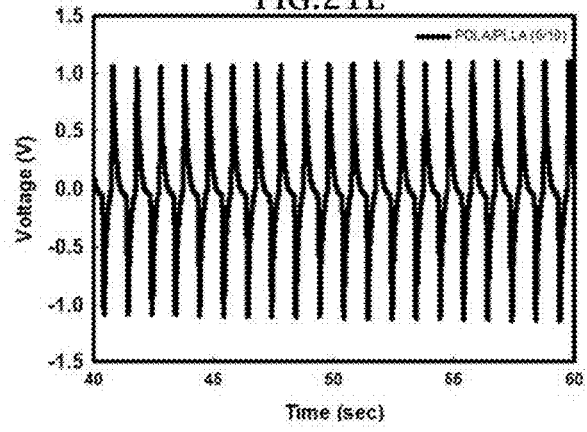

FIGS. 18A to 18C illustrate the XRD profiles of the PLA nanofiber webs depending on the PDLA/PLLA blend ratio and the annealing conditions. As in the measurement of DSC, all of the samples were measured for XRD at room temperature, instead of applying a dynamic heating process (10° C./min). That is, the diffraction peak in the XRD data appears only in the crystallization region formed during the electrospinning process. No diffraction peak appeared in the PLLA nanofiber web, whereas diffraction peaks were observed at 2θ=16.4° and 18.7° in the PDLA nanofiber web (FIG. 18A). The reason why no significant diffraction peak appeared in the PLLA nanofiber web is that the solvent is rapidly evaporated during the electrospinning and the D-isomer content of the PLLA sample is high. On the other hand, the diffraction peaks observed at 2θ=16.4° and 18.7° in PDLA are associated with the fact that crystallization may occur through evaporation of the solvent during the electrospinning even without the annealing because the L-isomer content of PDLA is much lower than the D-isomer content of PLLA. The diffraction peaks of the homo-PLA sample at 2θ=16.4° and 18.7° respectively show a (110)/(200) Miller plane and a (203) Miller plane of α-crystal ($10_3$ helical crystal, orthorhombic system).

In order to evaluate the likelihood of the formation of SC (stereocomplex) through electrospinning in the PDLA/PLLA blend, the nanofiber webs were annealed at 80° C. and 120° C. for 12 hr. As illustrated in FIGS. 18B and 18C, as the nanofiber web samples were annealed, the intensity of the diffraction peak was increased in all samples, regardless of the blend ratio. The diffraction peak of the sample annealed at 120° C. was stronger than that of the sample annealed at 80° C. The homocrystals were observed in the PDLA alone, PLLA alone, and PDLA/PLLA (9/1) blend, but SC-PLA was formed in the PDLA/PLLA at 7:3 and 5:5, as is apparent from the diffraction peaks at 2θ=12°, 20.8° and 24°. Respective diffraction peaks show a (010) Miller plane, a (300)/(030) Miller plane, and a (220) Miller plane in the triclinic unit cell system (a=b=0.916 nm, c=0.870 nm, α=β=109.2° and γ=109.8°) for the $3_1$ helical SC-PLA sample. Specifically, due to the drawing effect of the application of a high DC electric field upon electrospinning, the close contact of PDLA-PLLA by induced dipoles is further facilitated in coincidence with easy formation of a $3_1$ helix, and thus, the distance of $CH_3 \ldots O=C$ when PDLA-PLLA are adjacent to each other is much closer than the distance of $CH_3 \ldots O=C$ between the polymer chains when PDLA-PDLA or PLLA-PLLA are adjacent to each other, yielding the $3_1$ helical PDLA/PLLA stereocomplex that is more thermodynamically stable. Hence, since the formation of SC-PLA crystal nuclei is much easier than the formation of homocrystal nuclei of PDLA or PLLA, the molecular chains in the non-crystallization region in the annealing process are alternately dispersed to form the SC-PLA crystal nuclei, from which the SC-PLA crystals grow. In the blend at a racemic mixing ratio of 5:5, no diffraction peak of the homocrystals of PDLA or PLLA is apparent after annealing, but in contrast, not only the diffraction peak of the SC-PLA crystals but also the weak diffraction peak of the homocrystals of PDLA or PLLA are observed in the 7:3 blend.

2-2-5. Analysis of Piezoelectric Properties of SC-PLA

Under the test condition whereby the input resistance $R_{in}$, signal amplification scale and external pressure are the same, all the sensors produced piezoelectric output signals regardless of the PDLA/PLLA ratio or the annealing temperature (FIGS. 19A to 19E~FIGS. 21A to 21E). In the dynamic pressure testing, the piezoelectric output voltages and the normalized current values of the nanofiber webs (electrospinning and annealing at 80° C. and 120° C. for 12 hr) depending on the PDLA/PLLA blend ratio (10/0, 9/1, 7/3, 5/5 and 0/10) are shown in Tables 1 and 2 below. Since it is difficult to obtain samples in which the density and thickness of the nanofiber web are always constant upon electrospinning, it is hard to compare the piezoelectric properties of the samples based on the voltage results of Table 1. Thus, the measured voltage of each sample was applied to the following three equations, and the piezoelectric properties of the samples were compared based on the normalized piezoelectric current generated from 1 g of the sample when a load of 1 kgf was applied to the sample. The normalization process was performed as follows. Specifically, a nanofiber web was cut to a size of 1 cm×1 cm, the thickness and mass thereof were measured, the density (g/cm³) of the nanofiber web was calculated using Equation (3), and the weight of the nanofiber web present between the conductive upper/lower circular electrodes having a radius of 2 cm was determined using Equation (4). Then, as shown in Equation (5), the voltage measured in the piezoelectricity testing was divided by the input resistance ($R_{in}$), the weight of the nanofiber web and the applied load to determine the magnitude of normalized piezoelectric current. The results are given in Table 2 below.

$$\text{Density} = \frac{\text{mass}}{\text{volume}} = \frac{\text{mass}}{\text{area}(1\ \text{cm}) \times \text{thickness}} \quad (3)$$

$$\text{Mass of nanofiber web in sensor} = \text{density} \times \text{thickness} \times 3.14\ \text{cm} \quad (4)$$

$$\text{Normalized Current}\ (\mu\text{A/g}\cdot\text{kgf}) = \frac{\text{output voltage}}{\text{input impedance} \times \text{mass of nanofiber web in sensor} \times \text{applied pressure}} \quad (5)$$

As is apparent from Tables 1 and 2, the piezoelectric properties were increased with an increase in crystallinity at a high annealing temperature, thus offsetting the reduction in piezoelectric properties owing to the random orientation of C=O dipoles in the annealing process. In contrast, the high normalized current value (3.34 µA/g·kgf) of the PDLA alone, having homocrystals, was significantly decreased despite an increase in crystallinity after annealing, which is associated with the fact that the enhancement in piezoelectric properties resulting from the increase in crystallinity, achieved through annealing, may be offset by the random orientation of the C=O dipoles. As described above, the normalized current values of the PDLA/PLLA (7:3 and 5:5) were decreased to 1.05 and 1.29 µA/g·kgf from 1.82 and 2.06 µA/g·kgf after annealing at 80° C. for 12 hr. The PDLA/PLLA blend nanofiber web samples at 7:3 and 5:5 showed higher normalized current values (1.37 and 2.19 µA/g·kgf) upon annealing at 120° C. than upon annealing at 80° C. (1.05 and 1.29 µA/g·kgf). The reason is that an improvement in crystallinity greatly contributes to enhancement of piezoelectric properties, compared to the effect in which piezoelectric properties are decreased due to the random orientation of the C=O dipoles by thermal energy. Additionally, the current values produced in the PDLA/PLLA (7:3 and 5:5) blend nanofiber webs were the most stable regardless of the annealing conditions. This is considered to be due to higher thermal stability in the SC-PLA than in PLA alone. Based on such results, this piezoelectric material is useful in manufacturing wearable piezoelectric sensors and actuators requiring high-temperature durability.

TABLE 1

| Output Voltage ($R_{in}$ = 1 GΩ, Load = 0.96~1.18 kgf) | | | | | |
|---|---|---|---|---|---|
| PDLA/PLLA ratio | 10/0 | 9/1 | 7/3 | 5/5 | 0/10 |
| As-spun | 5.51 | 1.24 | 2.36 | 3.27 | 4.04 |
| Annealing at 80° C. | 2.65 | 2.35 | 2.42 | 2.35 | 4.39 |
| Annealing at 120° C. | 3.47 | 2.05 | 3.47 | 8.10 | 2.18 |

TABLE 2

| Normalized Current (µA/g · kgf) | | | | | |
|---|---|---|---|---|---|
| PDLA/PLLA ratio | 10/0 | 9/1 | 7/3 | 5/5 | 0/10 |
| As-spun | 3.34 | 0.66 | 1.82 | 2.06 | 1.01 |
| Annealing at 80° C. | 1.17 | 0.96 | 1.05 | 1.29 | 1.70 |
| Annealing at 120° C. | 1.09 | 0.62 | 1.37 | 2.19 | 0.61 |

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A piezoelectric sensor, comprising:
   a nanofiber web having stereocomplex crystals of poly(D-lactic acid) (PDLA) and poly(L-lactic acid) (PLLA), wherein the nanofiber web is manufactured by electrospinning a blend resin composition of PDLA and PLLA to a collector using a needle with each of the needle and the collector applied by a DC voltage;
   a first electrode disposed at a needle direction of the nanofiber web; and
   a second electrode disposed at a collector direction of the nanofiber web.

2. The piezoelectric sensor of claim 1,
   wherein the blend resin composition comprises poly(D-lactic acid) and poly(L-lactic acid) blended at a weight ratio ranging from 7:3 to 3:7.

3. The piezoelectric sensor of claim 1,
   wherein the piezoelectric material is manufactured by annealing the nanofiber web at 60 to 190° C.

4. The piezoelectric sensor of claim 3,
   wherein the annealing is performed for a period of time ranging from 10 min to 24 hr.

5. A method of manufacturing the piezoelectric sensor according to claim 1, the method comprising performing said electrospinning process according to steps comprising:
   a) preparing a spinning solution by dissolving poly(D-lactic acid) and poly(L-lactic acid) in a solvent; and
   b) manufacturing a nanofiber web by electrospinning the spinning solution.

6. The method of claim 5, wherein the poly(D-lactic acid) and the poly(L-lactic acid) are dissolved in the solvent at a weight ratio ranging from 7:3 to 3:7.

7. The method of claim 5, further comprising c) annealing the nanofiber web at 60 to 190° C., after b).

8. The method of claim 7, wherein the annealing is performed for a period of time ranging from 10 min to 24 hr.

9. The method of claim 5, wherein the solvent is a mixed solvent comprising a first solvent, selected from among chloroform and tetrahydrofuran (THF), and a second solvent, selected from among N,N-dimethylacetamide (DMAc), N,N-dimethylformamide (DMF), and dimethylsulfoxide (DMSO).

10. The method of claim 9, wherein a mixing ratio of the first solvent and the second solvent is a volume ratio ranging from 2:1 to 4:1.

11. The method of claim 10, wherein the poly(D-lactic acid) and the poly(L-lactic acid) are dissolved so that a combined weight thereof is 5 to 20 wt % of a weight of the spinning solution.

* * * * *